United States Patent
Lai et al.

(10) Patent No.: US 10,790,269 B2
(45) Date of Patent: Sep. 29, 2020

(54) SEMICONDUCTOR DEVICES AND SEMICONDUCTOR STRUCTURES

(71) Applicant: Taiwan Semiconductor Manufacturing Co., Ltd., Hsinchu (TW)

(72) Inventors: Chi-Hui Lai, Taichung (TW); Chen-Hua Yu, Hsinchu (TW); Chung-Shi Liu, Hsinchu (TW); Hao-Yi Tsai, Hsinchu (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/260,151

(22) Filed: Jan. 29, 2019

(65) Prior Publication Data
US 2020/0243494 A1     Jul. 30, 2020

(51) Int. Cl.
*H01L 25/16*     (2006.01)
*H01L 23/40*     (2006.01)
*H01L 23/31*     (2006.01)
*H01R 12/70*     (2011.01)
*H01L 23/50*     (2006.01)
*H01L 23/498*    (2006.01)

(52) U.S. Cl.
CPC .......... *H01L 25/16* (2013.01); *H01L 23/3128* (2013.01); *H01L 23/4006* (2013.01); *H01L 23/49822* (2013.01); *H01L 23/49827* (2013.01); *H01L 23/50* (2013.01); *H01R 12/7047* (2013.01)

(58) Field of Classification Search
CPC . H01L 25/16; H01L 23/3128; H01L 23/4006; H01L 23/49822; H01L 23/49827; H01L 23/50; H01R 12/7047
USPC ......................................................... 257/692
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2003/0171011 A1* | 9/2003 | Li .......................... H01R 31/08 439/68 |

(Continued)

*Primary Examiner* — Tu-Tu V Ho
(74) *Attorney, Agent, or Firm* — JCIPRNET

(57) ABSTRACT

Semiconductor devices and semiconductor structures are disclosed. One of the semiconductor device includes a semiconductor package and a connector. The semiconductor package includes at least one die in a die region, an encapsulant in a periphery region aside the die region and a redistribution structure in the die region and the periphery region. The encapsulant encapsulates the at least one die. The redistribution structure is electrically connected to the die. The connector is disposed on the redistribution structure in the periphery region. The connector includes a plurality of connecting elements, wherein the connector is electrically connected to the redistribution structure through the plurality of connecting elements.

20 Claims, 23 Drawing Sheets

(56) References Cited

U.S. PATENT DOCUMENTS

| | | | |
|---|---|---|---|
| 2010/0072593 A1* | 3/2010 | Kim | H01L 23/49575 |
| | | | 257/676 |
| 2011/0294315 A1* | 12/2011 | Kawabata | G06K 7/0078 |
| | | | 439/81 |
| 2015/0235989 A1* | 8/2015 | Yu | H01L 25/50 |
| | | | 257/712 |
| 2017/0207208 A1* | 7/2017 | Chen | H01L 25/105 |
| 2018/0309214 A1* | 10/2018 | Lloyd | H01R 12/73 |

* cited by examiner

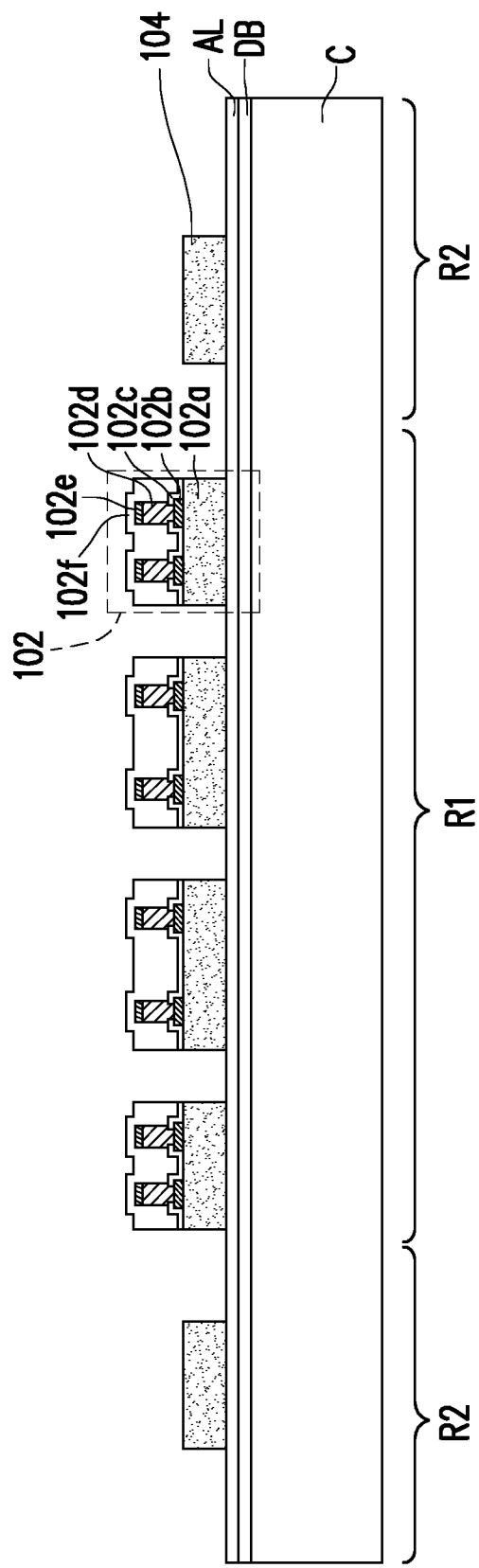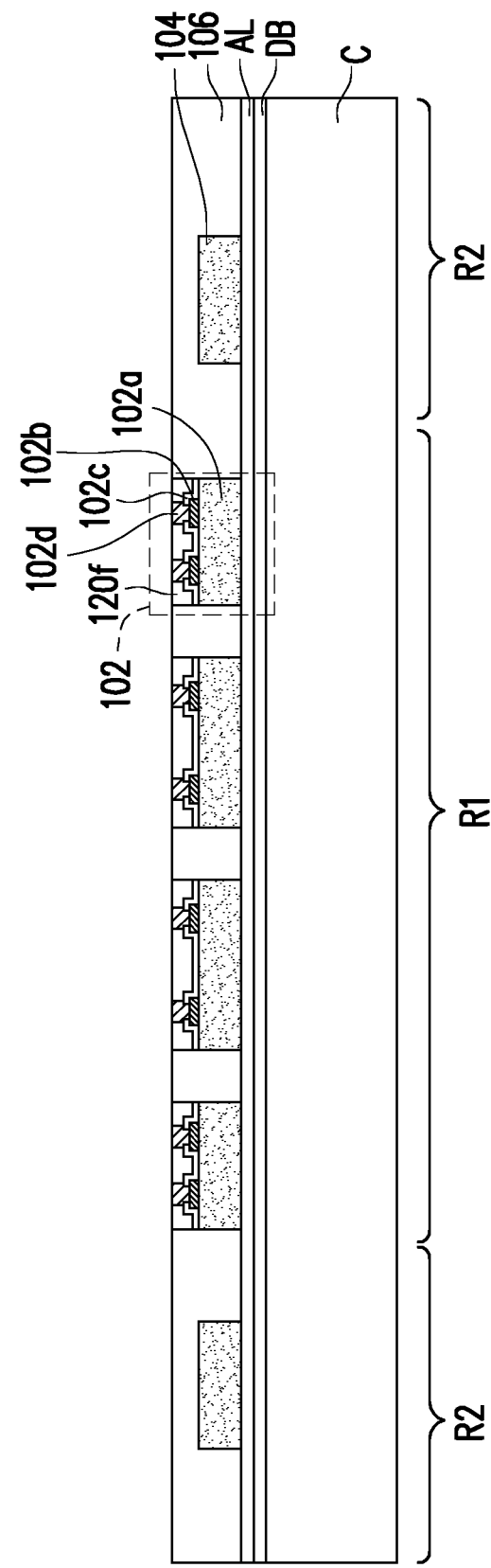

SEMICONDUCTOR DEVICES AND SEMICONDUCTOR STRUCTURES

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIGS. 1A to 1E are schematic cross-sectional views illustrating a method of manufacturing a semiconductor device in accordance with some embodiments of the disclosure.

DETAILED DESCRIPTION

Figure 1C:
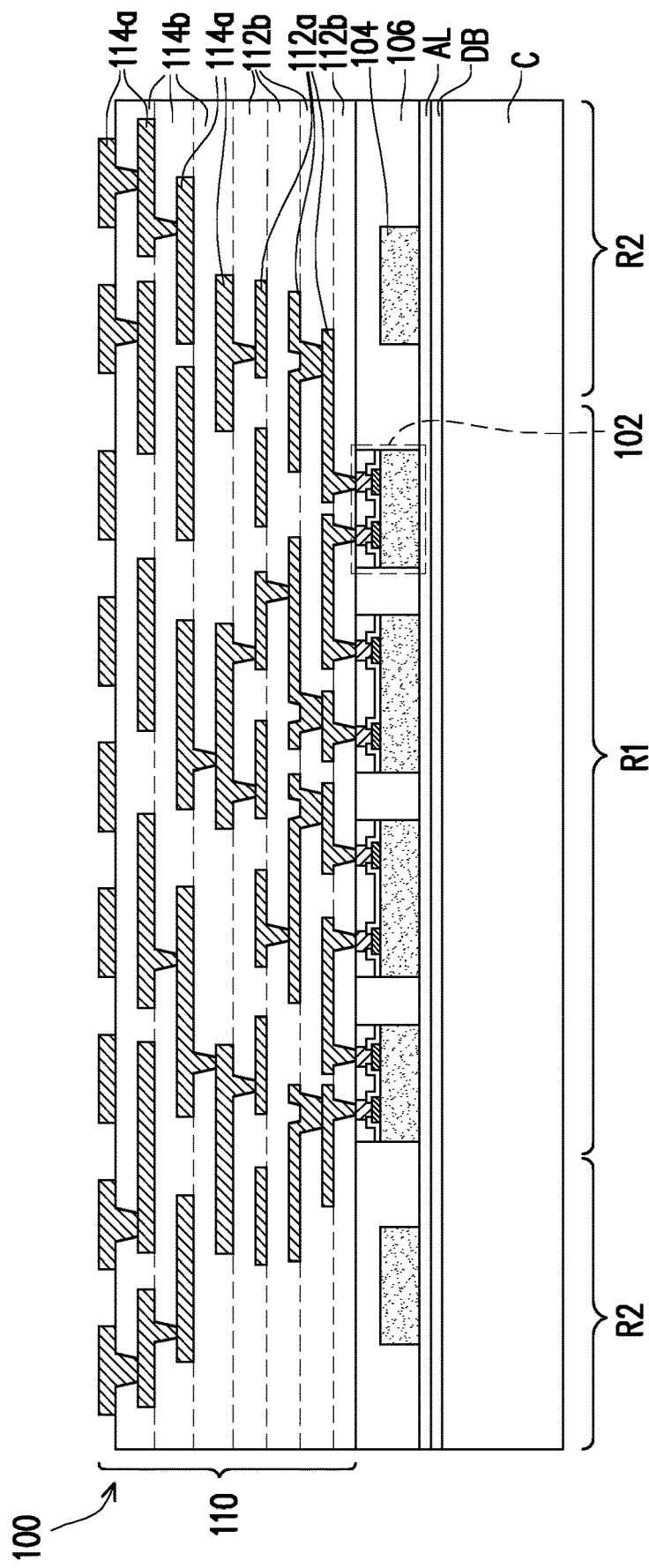

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description. Furthermore, terms, such as "physically connected," "physically connecting" and the like, may be used herein for ease of description to describe two elements are affixed together through direct physical contact or indirect physical contact, and the later means that the two elements are respectively in direct contact with at least one element therebetween.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A to 1E are schematic cross-sectional views illustrating a method of manufacturing a semiconductor device in accordance with some embodiments of the disclosure. FIGS. 2A to 2E are top views respectively illustrating a semiconductor device in accordance with some embodiments of the disclosure. Referring to FIG. 1A, a carrier C is provided. A de-bonding layer DB and an adhesive layer AL are stacked over the carrier C in sequential order. In some embodiments, the de-bonding layer DB is formed on the upper surface of the carrier C, and the de-bonding layer DB is between the carrier C and the adhesive layer AL. The carrier C is, for example, a glass substrate. On the other hand, in some embodiments, the de-bonding layer DB is a light-to heat-conversion (LTHC) release layer formed on the glass substrate. In some embodiments, the adhesive layer AL is a die attach film, for example. In some alternative embodiments, a dielectric layer may be further disposed on the adhesive layer AL, and a material of the dielectric layer may be polymer such as polyimide, benzocyclobutene (BCB), polybenzoxazole (PBO), or the like. In some alternative embodiments, the dielectric layer may include non-organic dielectric materials such as silicon oxide, silicon nitride, silicon carbide, silicon oxynitride, or the like. However, the materials of the de-bonding layer DB, the carrier C, the adhesive layer AL and the dielectric layer are merely for illustration, and the disclosure is not limited thereto.

Figure 1D:
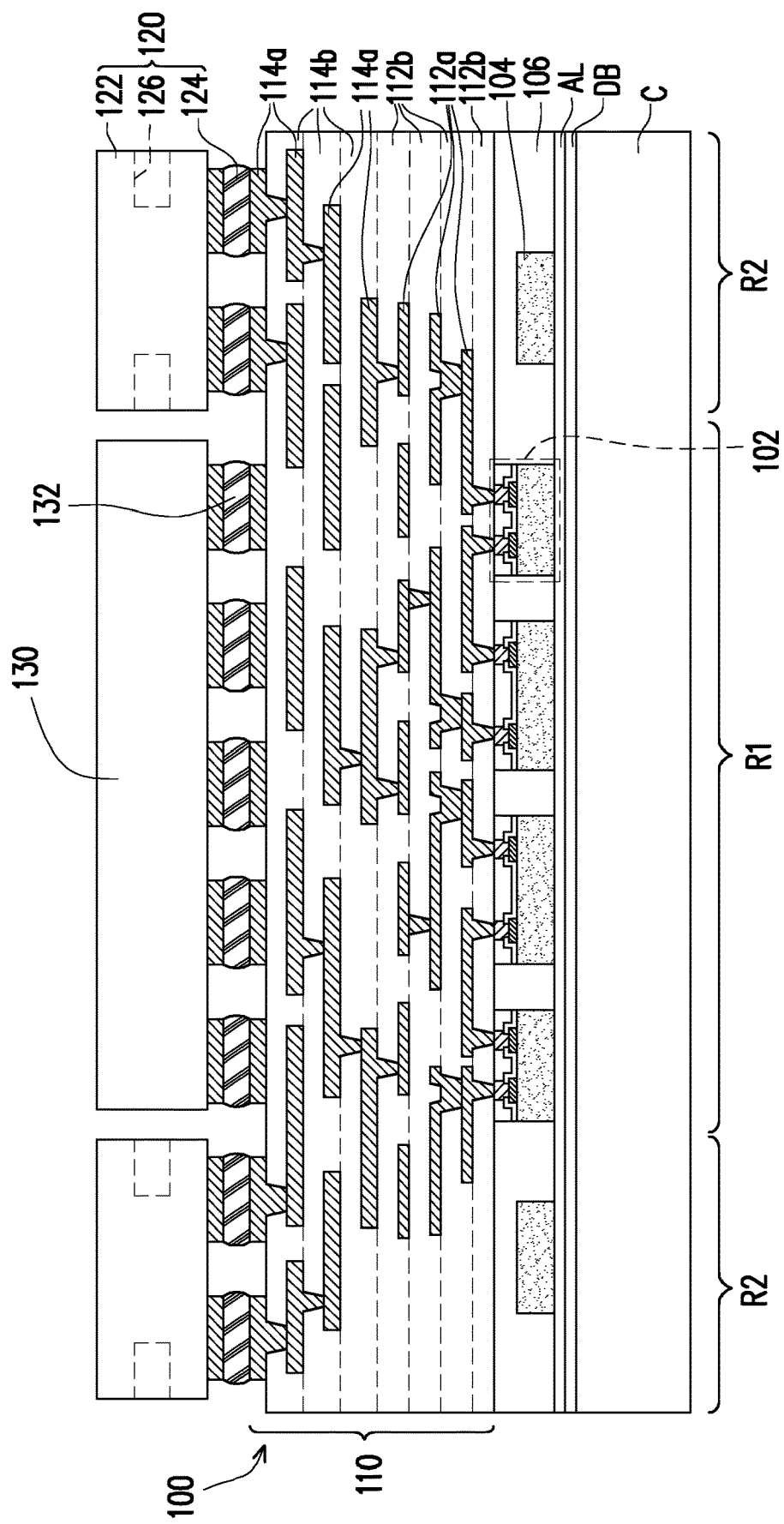
Figure 2B:
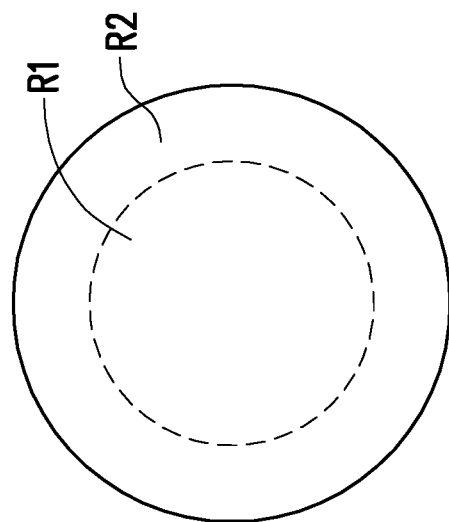
FIGS. 2A to 2E are top views respectively illustrating a semiconductor device in accordance with some embodiments of the disclosure.
Figure 2A:
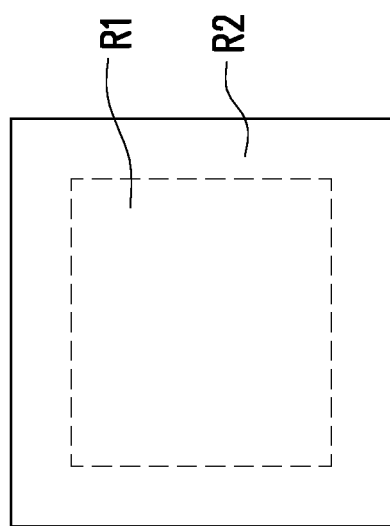
Figure 2E:
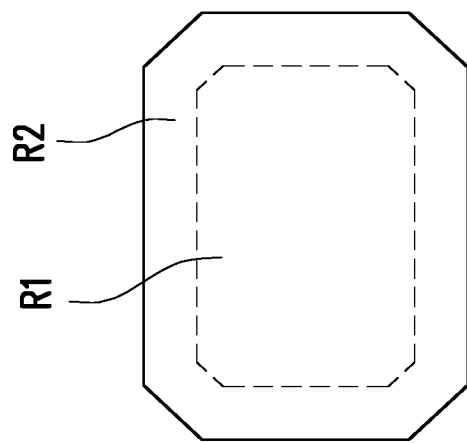
Figure 2D:
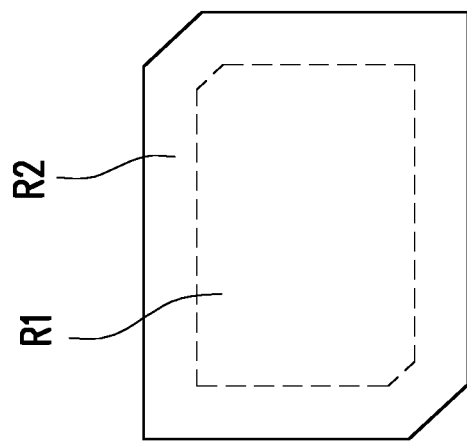
Figure 2C:
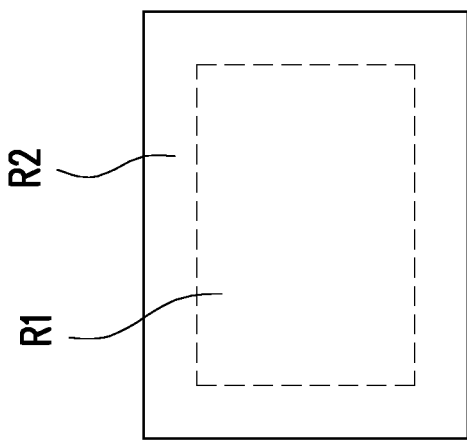

In some embodiments, as shown in FIGS. 1A and 2A, a region R which the semiconductor package occupies includes a die region R1 and a periphery region R2, and the die region R1 and the periphery region R2 are separated without overlapping each other, for example. In some embodiments, the die region R1 is the region in which dies 102 are formed and also referred to as a function die region, and the periphery region R2 is the region in which connectors 120 (as shown in FIG. 1D) are formed. In some embodiments, the total area of the die region R1 and the periphery region R2 may be larger than 10,000 mm$^2$, for example. That is, the semiconductor package may be a super large package, for example. In some embodiments, the ratio of the area of the die region R1 to the area of the periphery region R2 may range from 0.8 to 8, for example. In some embodiments, the die region R1 is surrounded by the periphery region R2, for example. In some embodiments, as shown in FIG. 2A, a shape of the region R may be square, for example. However, the invention is not limited thereto. In some alternative embodiments, the shape of the region R may be circular (as shown in FIG. 2B), rectangular (as shown in FIG. 2C) or other suitable shape. In addition, in some alternative embodiments, the region R may be formed with at least one corner cut, as shown in FIGS. 2D and 2E, for example.

In some embodiments, a plurality of dies 102 are mounted onto the carrier C in the die region R1. However, the invention is not limited thereto. In some alternative embodiments, there may be only one die 102 mounted onto the carrier C. The dies 102 are, for example, semiconductor dies. In some embodiments, the adhesive layer AL may be located between the dies 102 and the carrier C for adhering the dies 102 onto the carrier C. In some embodiments, the dies 102 may be the same types of dies or different types of dies and may be digital dies, analog dies or mixed signal dies, such as application-specific integrated circuit ("ASIC") dies, high bandwidth memory (HBM) dies, sensor dies, wireless and radio frequency dies, memory dies, logic dies or voltage regulator dies. In some embodiments, a size (such as a width or a height) of the dies 102 may be the same or different. In some embodiments, the die 102 may include a substrate 102a, a plurality of pads 102b distributed on an active surface of the substrate 102a, a dielectric layer 102c covering the active surface 102a, a plurality of conductive pillars 102d, a plurality of solder layers 102e and a protection layer 102f. In some embodiments, the dielectric layer 102c is conformally formed over the pads 102b and has a plurality of openings to expose portions of the pads 102b respectively. The conductive pillars 102d are partially disposed in the openings of the dielectric layer 102c to electrically connect the pads 102b and partially disposed on the top surface of the dielectric layer 102c. In some embodiments, the solder layers 102e are respectively formed on the conductive pillars 102d. In some embodiments, the protection layer 102f is conformally formed on the dielectric layer 102c, the conductive pillars 102d and the solder layers 102e. In some embodiments, the top surfaces of the solder layers 102e may be lower than the top surface of the protection layer 102f, in other words, the protection layer 102f covers the solder layers 102e. In some embodiments, a material of the protection layer 102f may be a polybenzoxazole (PBO) layer, a polyimide (PI) layer or other suitable polymers. In some alternative embodiments, the protection layer 102f may be made of an inorganic material.

In some embodiments, a plurality of dummy dies 104 may be formed in the periphery region R2. In some embodiments, the dummy dies 104 may be picked and placed onto the carrier C simultaneously with the dies 102, and the dummy dies 104 may surround the dies 102, for example. In some embodiments, the dummy dies 104 may be semiconductor substrates such as silicon substrates. In some embodiments, a material of the semiconductor substrates may be the same as or different from the substrates 102a of the dies 102.

Referring to FIG. 1B, an encapsulant 106 is formed in the periphery region R2 on the carrier C to encapsulate the dies 102 and the dummy dies 104. In some embodiments, an encapsulation material (not shown) is formed to cover the dies 102 and the dummy dies 104, and then a planarization process is performed until the top surfaces of the dies 102 are exposed, so as to form the encapsulant 106. In some embodiments, during the planarization process, a portion of the encapsulation material, a portion of the protection layer 102f and the solder layers 102e are removed. In some embodiments, the solder layers 102e are entirely removed, so as to expose the top surfaces of the conductive pillars 102d. In some alternative embodiments, portions of the conductive pillars 102d may be also removed, for example. In some embodiments, the top surfaces of the conductive pillars 102d and the protection layer 102f are substantially coplanar with the top surface of the encapsulant 106. In some embodiments, the encapsulant 106 is a molding compound formed by a molding process. In some embodiments, the encapsulant 106 may include epoxy or other suitable materials. The planarization process is a chemical mechanical polish (CMP), for example. The encapsulant 106 encapsulates the sidewalls of the dies 102 and the dummy dies 104 and is disposed between the dies 102 and the dummy dies 104.

Referring to FIG. 1C, a redistribution structure 110 is formed over the dies 102 and the encapsulant 106 to electrically connect the dies 102. In some embodiments, the redistribution structure 110 includes a plurality of redistribution patterns 112a, 114a and a plurality of dielectric layers 112b, 114b alternately stacked. In some embodiments, the redistribution patterns 112a and the dielectric layers 112b are sequentially formed over the dies 102 and the encapsulant 106, and the redistribution patterns 114a and the dielectric layers 114b are sequentially formed over the redistribution patterns 112a and the dielectric layers 112b, for example. In some embodiments, the redistribution patterns 112a, 114a and the dielectric layers 112b, 114b form a plurality of fan-out redistribution layers. In some embodiments, the bottommost dielectric layer 112b is formed over and in contact with the dies 102 and the encapsulant 106, and the bottommost redistribution patterns 112a are formed in the bottommost dielectric layer 112b to electrically connect to the conductive pillars 102e of the dies 102. In some embodiments, the topmost redistribution patterns 114a may be under-ball metallurgy (UBM) patterns, for example. In some embodiments, the redistribution patterns 112a and the dielectric layers 112b are adjacent to the dies 102, and the redistribution patterns 114a and the dielectric layers 114b are adjacent to the connectors 120 and the sockets 130 to be formed (as shown in FIG. 1D). In some embodiments, to avoid line breakage, a thickness of the redistribution pattern 114a may be larger than a thickness of the redistribution pattern 112a therebeneath, for example. Similarly, a thickness of the dielectric layer 114b may be larger than a thickness of the dielectric layer 114a therebeneath, for example.

In some embodiments, the redistribution patterns 112a, 114a may include a plurality of seed layer patterns and a plurality of conductive patterns thereon, for example. The redistribution patterns 112a, 114a may be formed by forming a seed layer on the dielectric layer 112b, 114b, forming a mask layer having a plurality of openings to expose portions of the seed layer, forming the conductive patterns in the openings, removing the mask layer, and removing portions of the seed layer by using the conductive patterns as a mask to form the seed layer patterns beneath the conductive patterns. In some embodiments, the seed layer may be formed by a coating process, and the conductive patterns may be formed by a plating process, for example. The mask layer may be a photoresist layer, and may be formed by a coating process, an exposure process, a development process and a curing process. In some embodiments, after forming the redistribution structure 110, the semiconductor package 100 is formed and includes the dies 102, the encapsulant 106 encapsulating the dies 102 and the redistribution structure 110 over the dies 102 and the encapsulant 106. In some embodiments, the semiconductor package 100 may be a super large package, for example. In some embodiments, the semiconductor package 100 may be an integrated fan-out (INFO) wafer level package, for example.

Figure 3B:
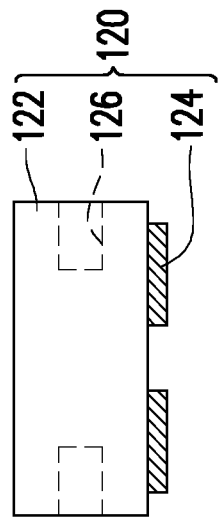
FIGS. 3A and 3B are schematic cross-sectional views illustrating a connector of a semiconductor device in accordance with some embodiments of the disclosure.
Figure 3A:
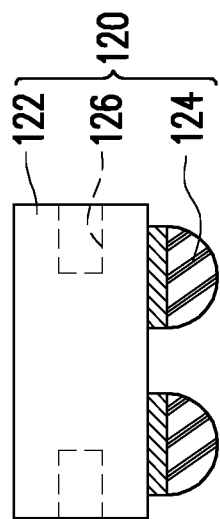

Referring to FIG. 1D, a plurality of connectors 120 of FIG. 3A are formed over the redistribution structure 110 in the periphery region R2 of the semiconductor package 100. In some embodiments, the connectors 120 are disposed along a periphery of the semiconductor package 100, for example. In some embodiments, the connector 120 may include a connecting housing 122, a connecting assembly (not shown), a plurality of connecting elements 124 and a connecting portion 126, for example. The connecting portion 126 is different from the connecting elements 124, and the connecting portion 126 and the connecting elements 124 are at different sides of the connecting housing 122. For example, the connecting elements 124 are at a bottom side of the connecting housing 122, and the connecting portion 126 is at a left or right side of the connecting housing 122. In some embodiments, a material of the connecting housing 122 may be nonconductive, for example. In some embodiments, the connecting assembly is located in the lumen defined by the connecting housing 122, and the connecting elements 124 are electrically connected to the connecting assembly and extend outside and protrudes from the connecting housing 122. The connecting portion 126 may be a male connecting portion or a female connecting portion, and may be integrally formed with the connecting housing 122. In some embodiments, as shown in FIGS. 1D and 3A, the connecting portion 126 may be a hole, which may be engaged with a protrusion of another connector, for example. However, the invention is not limited thereto. In some alternative embodiments, the connecting portion may have other structure which is suitable to mated with other connectors.

The connecting elements 124 are parts of the connector 120 which are physically and electrically connected to the semiconductor package 100 and disposed at the terminal of the connector 120. In some embodiments, the connecting element 124 may be a solder ball, and the connector 120 may be a ball grid array (BGA) type connector, for example. However, the invention is not limited thereto. In some embodiments, the connectors 120 may be flexible flat cable/flexible printed circuit (FFC/FPC) connectors, mezzanine connectors, backplane connectors, quad small form factor pluggable (QSFP) connectors, a combination thereof or other suitable connectors. In some embodiments, before forming the connectors 120, by providing a stencil over the carrier C, a flux (not shown) is printing onto the top surfaces of the topmost redistribution patterns 114a of the redistribution structure 110, for example. In some embodiments, the stencil has a plurality of apertures to expose portions of the topmost redistribution patterns 114a in the periphery region R2. Then, the connectors 120 are picked and placed onto the flux on the topmost redistribution patterns 114a of the redistribution structure 110, and a joint process such as a reflow process is performed, so that the connecting elements 124 are reflowed to attach to the topmost redistribution patterns 114a in the periphery region R2. In some alternative embodiments, the connecting element 124 may be a land as shown in FIG. 3B, and the connector 120 may be a land grid array (LGA) type connector, and a solder paste may be printing onto the top surface of the topmost redistribution pattern 114a of the redistribution structure 110 before placing the connector 120, for example.

In some embodiments, a socket 130 may be formed over the redistribution structure 110 aside the connector 120. In some embodiments, the socket 130 is disposed in the die region R1 of the semiconductor package 100 and surrounded by the connectors 120, for example. In other words, the connectors 120 are disposed at opposite sides of the socket 130, for example. The socket 130 may be served as a power supply or providing other suitable function, for example. In some embodiments, the socket 130 has a plurality of connecting elements 132 such as solder balls thereon which are physically and electrically connected to the semiconductor package 100. The structure of the connecting elements 132 may be similar to that of the connecting elements 124 of the connector 120. In some embodiments, the socket 130 is picked and placed onto the flux on the topmost redistribution patterns 114a of the redistribution structure 110 in the die region R1, and during the aforementioned joint process, the connecting elements 132 of the socket 130 are reflowed to attach to the topmost redistribution patterns 114a in the die region RE for example. In some embodiments, the sockets 130 may be formed before or after the connectors 120.

Figure 1E:
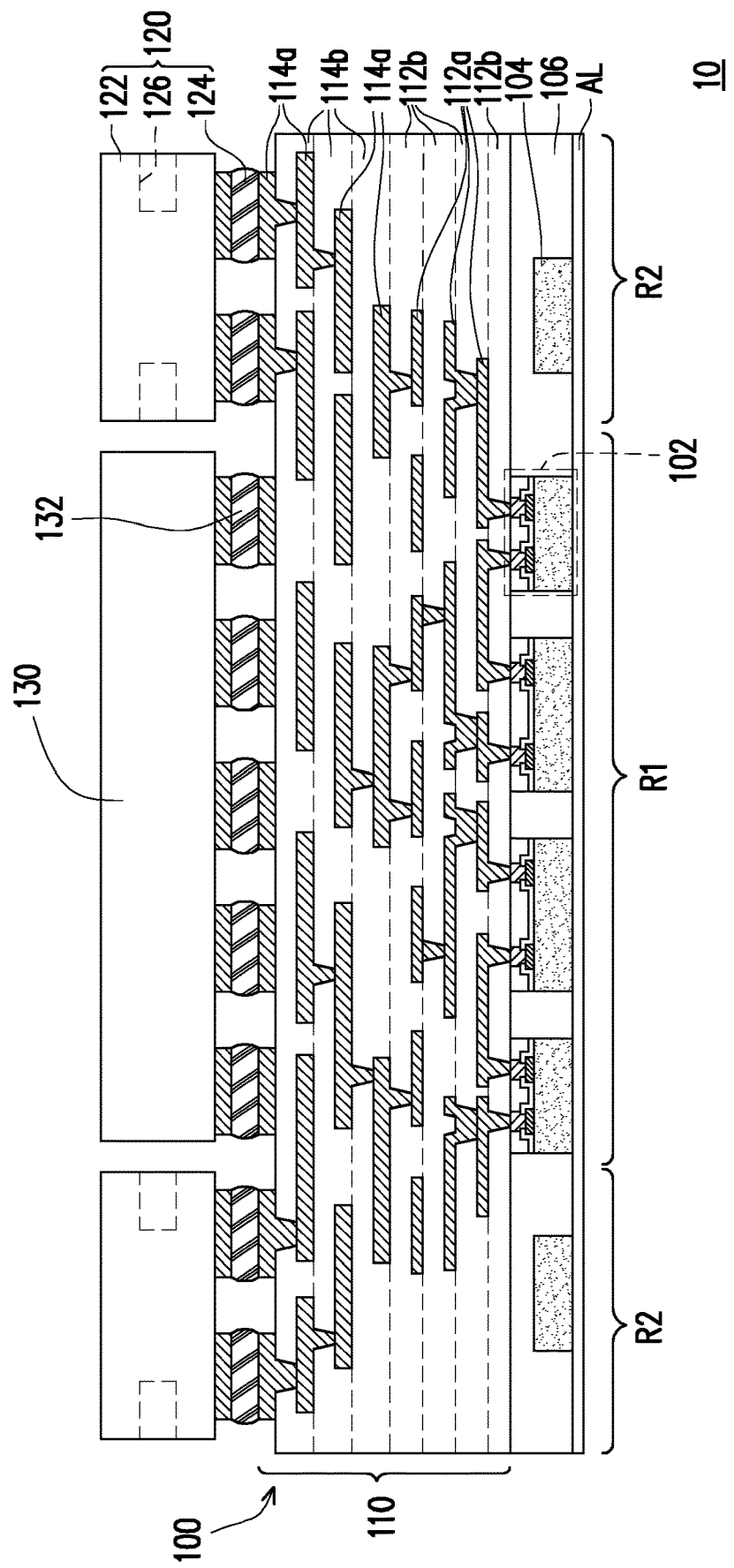

Referring to FIG. 1E, in some embodiments, after attaching the connectors 120 and the socket 130 onto the semiconductor package 100, the carrier C is removed, and a semiconductor device 10 is formed. In some embodiments, the adhesive layer AL formed on the bottom surface of the encapsulant 106 is de-bonded from the de-bonding layer DB such that the adhesive layer AL is separated from the carrier C. That is, the carrier C is removed. In some embodiments, the de-bonding layer DB (e.g., the LTHC release layer) may be irradiated by an UV laser such that the adhesive layer AL adhered on the bottom surface of the encapsulant 106 is peeled from the carrier C.

Conventionally, the connectors and the semiconductor package are independently assembled to the circuit board, and the connectors and the semiconductor package are electrically connected each other through the circuit board. On contrary, in some embodiments, the connectors 120 are integrated onto and directly electrically connected to the semiconductor package 100, and thus the connectors 120 may serve as external input/output terminals of the semiconductor package 100. In other words, the semiconductor package 100 may serve as an accelerator without the need of the circuit board, for example. Accordingly, the signal pathway therebetween becomes shorter. Therefore, signal loss due to long pathway and/or insertion may be prevented. Furthermore, the package device 10 may be provided in a high-performance computing system, to provide high data transmission rate.

Figure 4:
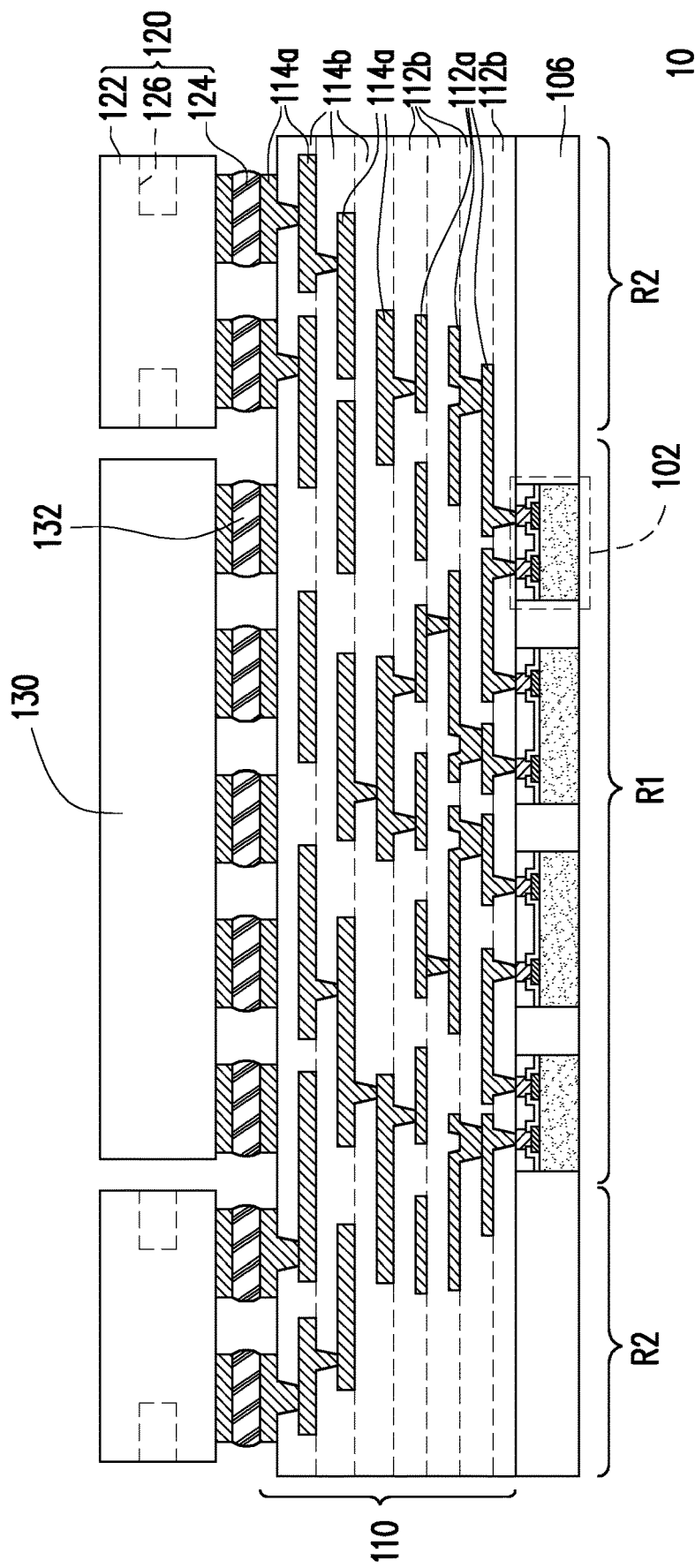
FIG. 4 is a schematic cross-sectional view illustrating a semiconductor device in accordance with some embodiments of the disclosure.

It is noted that in some embodiments, the dummy dies 104 are formed aside the dies 102, however, the invention is not limited thereto. In some alternative embodiments, as shown in FIG. 4, the dummy dies 104 may be omitted. In other words, the dummy dies 104 are optionally formed. In addition, as shown in FIG. 4, the adhesive layer AL may be removed, and thus the backside of the dies 102 are exposed.

Figure 5:
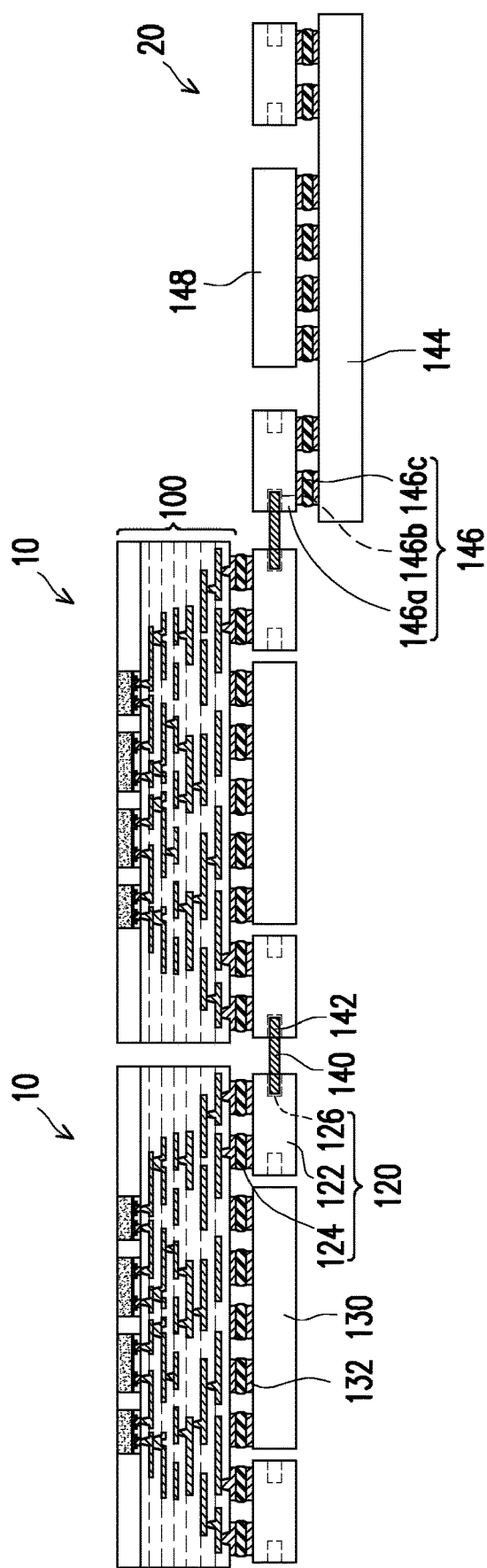
FIG. 5 is a schematic cross-sectional view illustrating a semiconductor structure in accordance with some embodiments of the disclosure.

As mentioned before, the connectors may serve as external input/output terminals of the semiconductor package, and thus the semiconductor device may connect to another electrical device such as another semiconductor device or a circuit board through the connector. In some embodiments, as shown in FIG. 5, a plurality of semiconductor devices 10 are connected to each other through physically connecting the connectors 120 thereof. In some embodiments, the connectors 120 of different semiconductor devices 10 may be physically connected by a cable 140 therebetween. In some embodiments, the cable 140 may flexible and has a male/female connecting portion 142. In addition, the semiconductor device 10 may be further connected to an electrical device 20. In some embodiments, the electrical device 20 may be, for example, a central processing unit (CPU) board and includes a circuit board 144 and a connector 146 and a CPU 148 on the circuit board 144. In some embodiments, the connector 146 includes a connecting housing 146a, a plurality of connecting elements 146b and a connecting portion 146c. The connecting portion 146c is different from the connecting elements 146b, and the connecting portion 146c and the connecting elements 146b are disposed at different sides of the connector 146. The connecting elements 146b may be solder balls, lands, pins, springs or other suitable connecting elements. The connecting portion 146c may be a male connecting portion or a female connecting portion. The structure of the connector 146 is similar that of the connector 120, and thus the details are omitted herein. In some embodiments, the CPU 148 is bonded to the circuit board 144 through the connecting elements such as BGA, for example.

In some embodiments, the connector 120 of the semiconductor device 10 may be mated with the cable 140 or the connector 146 of the circuit board 144. For example, by engaging the male/female connecting portion 126 such as a hole of the connector 120 of the semiconductor device 10 with a male/female connecting portion 142, 146c such as a protrusion of the cable 140 or of the connector 146 of the circuit board 144, the connector 120 of the semiconductor device 10 is securely coupled with the cable 140 or the connector 146 of the electrical device 20. In some embodiments, the connectors of the semiconductor device may serve as external input/output terminals of the semiconductor package, and thus provide the electrical interconnects for signal, power and ground between the super large packages such as accelerators or between the super large package such as an accelerator and the circuit board such as CPU board.

Figure 6:
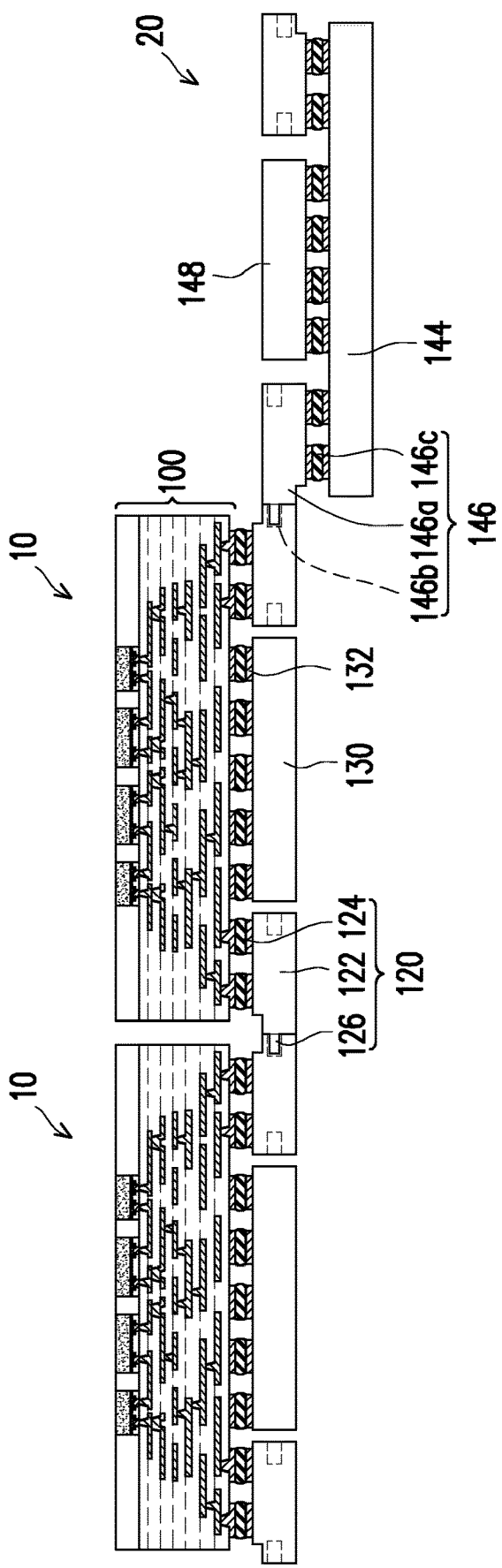
FIG. 6 is a schematic cross-sectional view illustrating a semiconductor structure in accordance with some embodiments of the disclosure.

In some embodiments, the connectors of the semiconductor devices and the electrical device are electrically connected to each other through the cables therebetween. However, the invention is not limited thereto. In some embodiments, as shown in FIG. 6, the connectors 120, 146 of the semiconductor devices 10 and the electrical device 20 may be electrically connected to each other through physically connecting the connectors 120, 146. In some embodiments, the connector 120 of the semiconductor device 10 may be mated with the connector 120 of another semiconductor device 10 or the connector 146 of the electrical device 20. For example, by engaging the male/female connecting portion 126 of the connector 120 of the semiconductor device 10 with the male/female connecting portion 126 of the connector 120 of another semiconductor device 10 or the male/female connecting portion 146c of the connector 146 of the electrical device 20, the connector 120 of the semiconductor device 10 is securely coupled with the connector 120 of another semiconductor device 10 or the connector 146 of the electrical device 20. In some embodiments, the semiconductor device 10 is disposed between the semiconductor device 10 and the electrical device 20. The connector 120 of the semiconductor device 10 at a first side is in contact with the connector 120 of another semiconductor device 10, and the connector 120 of the semiconductor device 10 at a second side opposite to the first side is in contact with the connector 146 of the electrical device 20. In some embodiments, the connectors 120, 146 may be right-angle connectors or other suitable connectors, for example.

Figure 7:
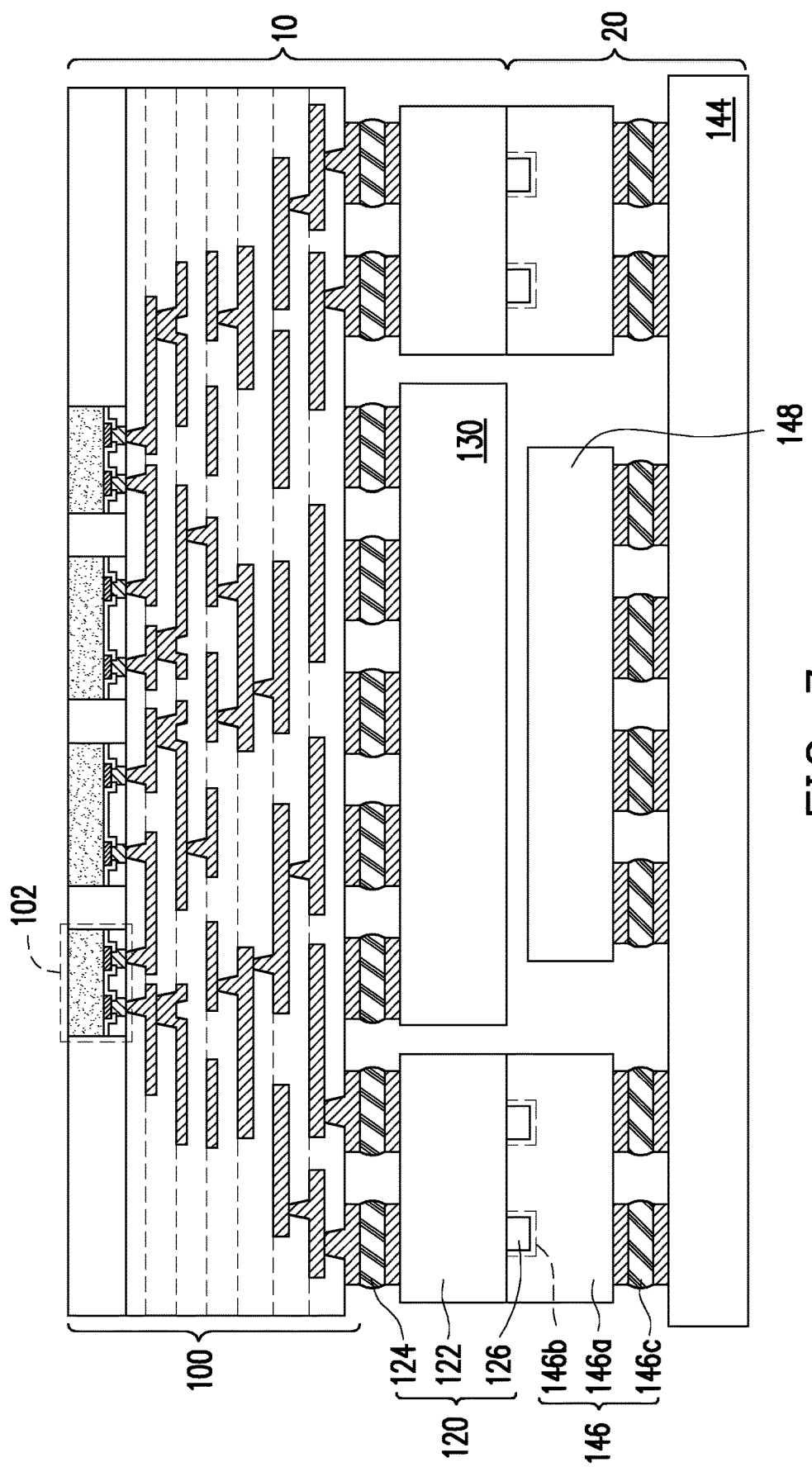
FIG. 7 is a schematic cross-sectional view illustrating a semiconductor structure in accordance with some embodiments of the disclosure.

In some embodiments, the semiconductor devices 10 and the electrical device 20 are connected to one another in a side by side manner, in other words, the semiconductor devices 10 may be arranged horizontally. However, the invention is not limited thereto. In some embodiments, as shown in FIG. 7, the semiconductor device 10 with the connectors 120 is stacked onto and bonded to the circuit board 144 with the connectors 146. In other words, the semiconductor device 10 and the circuit board 144 are disposed in a face to face relationship. In some embodiments, the connectors 120 of the semiconductor device 10 are aligned with and directly connected to the connectors 146 of the electrical device 20. In some embodiments, the connecting elements 124 and the connecting portion 126 are at opposite sides of the connector 120, for example. Similarly, the connecting elements 146b and the connecting portion 146c are at opposite sides of the connector 146, for example. In some embodiments, the connectors 120 of the semiconductor device 10 may be mated with the connectors 146 of the electrical device 20. For example, by engaging the male/female connecting portions 126 of the connectors 120 of the semiconductor device 10 with male/female connecting portions 146c of the connectors 146 of the electrical device 20, the connectors 120 of the semiconductor devices 10 are securely coupled with and the connectors 146 of the electrical device 20. In some embodiments, the socket 130 may be directly disposed over the CPU 148 and spaced from the CPU 148, for example.

Figure 8:
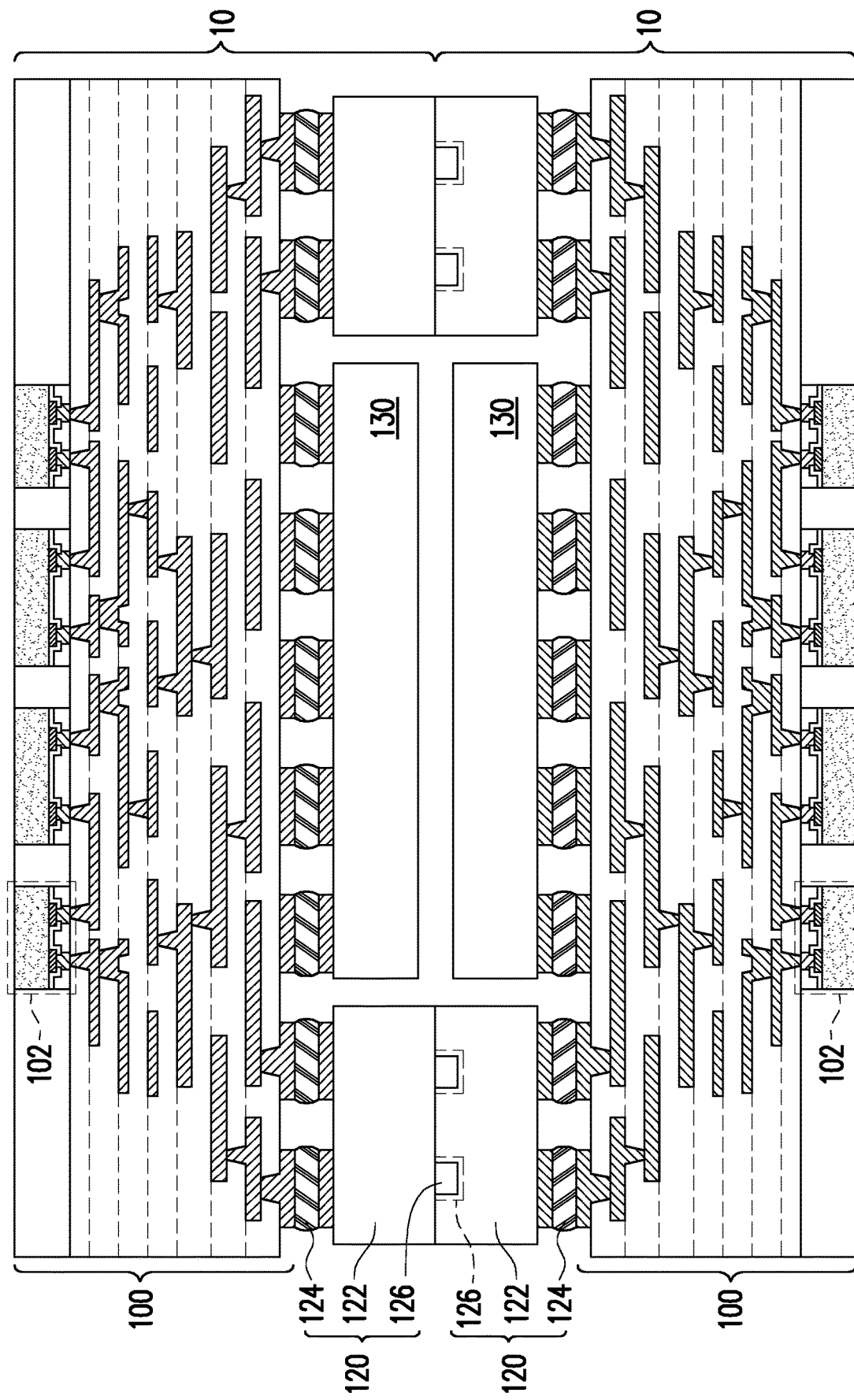
FIG. 8 is a schematic cross-sectional view illustrating a semiconductor structure in accordance with some embodiments of the disclosure.

In some embodiments, as shown in FIG. 8, the semiconductor device 10 with the connectors 120 is stacked onto another semiconductor device 10 with the connectors 120. In other words, the semiconductor devices 10 are disposed in a face to face relationship. In some embodiments, the connectors 120 of the semiconductor device 10 are aligned with and directly connected to the connectors 120 of another semiconductor device 10. In some embodiments, the connectors 120 of the semiconductor device 10 may be mated with the connectors 120 of another semiconductor device 10. For example, by engaging the male/female connecting portions 126 of the connectors 120 of the semiconductor device 10 with the male/female connecting portions 126 of the connectors 120 of another semiconductor device 10, the connector 120 of the semiconductor device 10 is securely coupled with the connector 120 of the semiconductor device 10. In some embodiments, the socket 130 of the semiconductor device 10 may be directly disposed over and spaced from the socket 130 of another semiconductor device 10, for example.

Figure 9A:
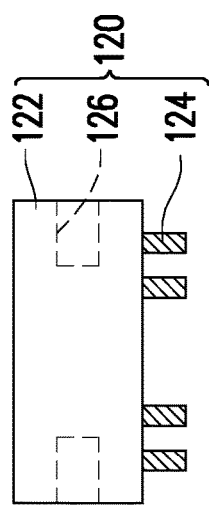
FIGS. 9A and 9B are schematic cross-sectional views respectively illustrating a connector and a semiconductor device including the connector in accordance with some embodiments of the disclosure.
Figure 9B:
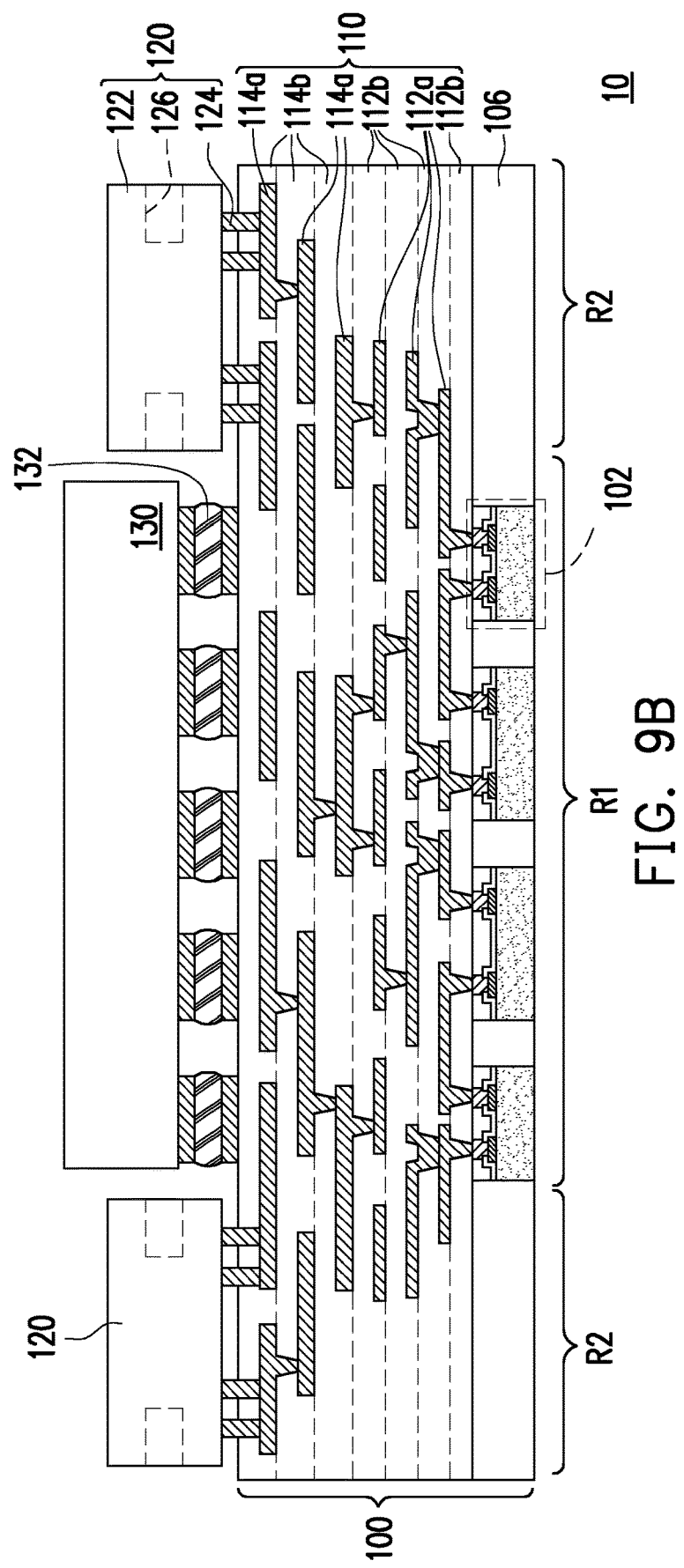

In some alternative embodiments, as shown in FIG. 9A, the connecting element 124 may be a pin, and the connector 120 may be a PGA (pin grid array) type connector, for example. In some alternative embodiments, as shown in FIG. 9B, the connector 120 is connected to the semiconductor package 100 to form the semiconductor device 10, and the joint process for the PGA type connector may be a press-fit process, for example.

Figure 10A:
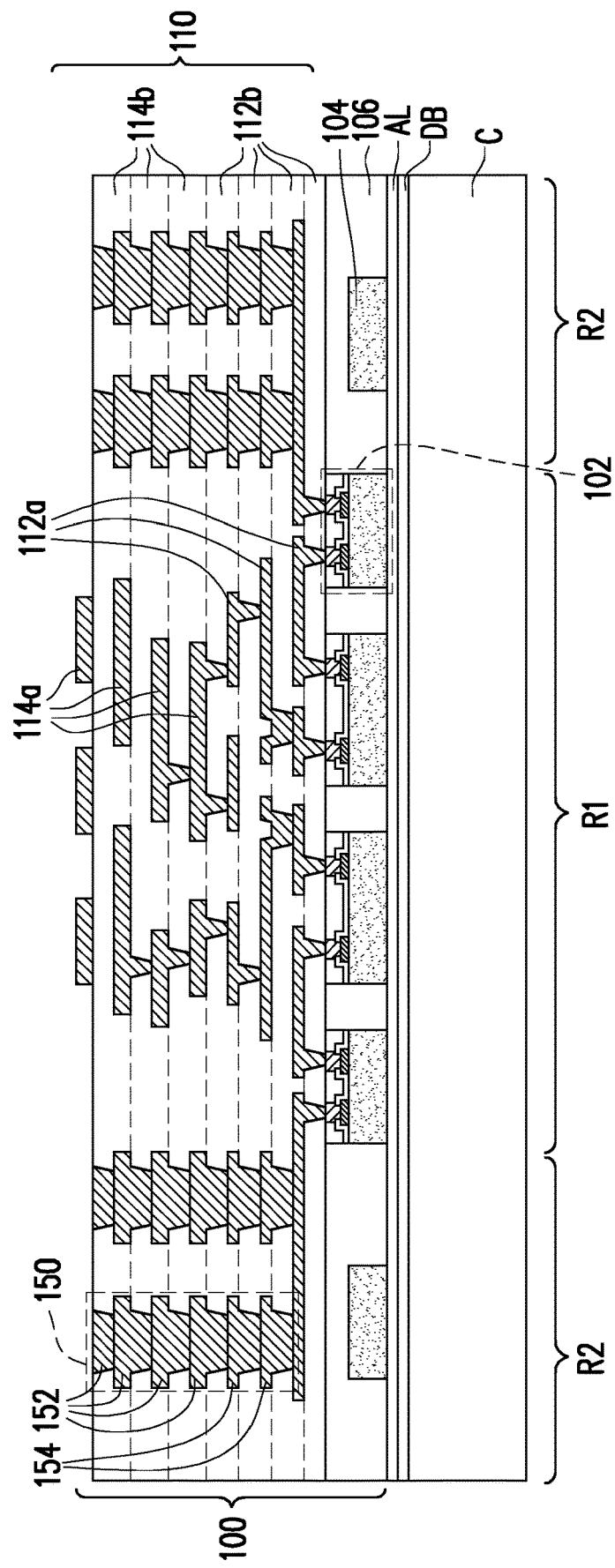
FIGS. 10A to 10D are schematic cross-sectional views illustrating a method of manufacturing a semiconductor device in accordance with some embodiments of the disclosure.

FIGS. 10A to 10D are schematic cross-sectional views illustrating a method of manufacturing a semiconductor device in accordance with some embodiments of the disclosure. Referring to FIG. 10A, a semiconductor package 100 is provided. The semiconductor package 100 of FIG. 10A is similar to the semiconductor package 100 of FIG. 1C, the main difference lies in that a plurality of vias 150 are formed in the periphery region R2. In some embodiments, the via 150 includes a plurality of conductive patterns 152 in the dielectric layers 112b of the redistribution structure 110 and a plurality of conductive patterns 154 in the dielectric layers 114b of the redistribution structure 110. The conductive patterns 152 are stacked on one another, and the conductive patterns 154 are stacked on one another on the conductive patterns 152. In some embodiments, the conductive patterns 152, 154 are vertically aligned and stacked, that is, the center lines of the conductive patterns 152, 154 are aligned and the conductive patterns 152, 154 have overlapping portions. In some embodiments, the via 150 is made up of the conductive patterns 152, 154, and the bottommost conductive pattern 152 is in contact with a redistribution patterns 112a therebeneath of the redistribution structure 110, for example. Accordingly, the via 150 is electrically connected to the die 102 through the redistribution patterns 112a therebeneath, for example. In some embodiments, the conductive patterns 152 are formed simultaneously with the redistribution patterns 112a, and the conductive patterns 154 are formed simultaneously with the redistribution patterns 114a, for example.

Figure 10B:
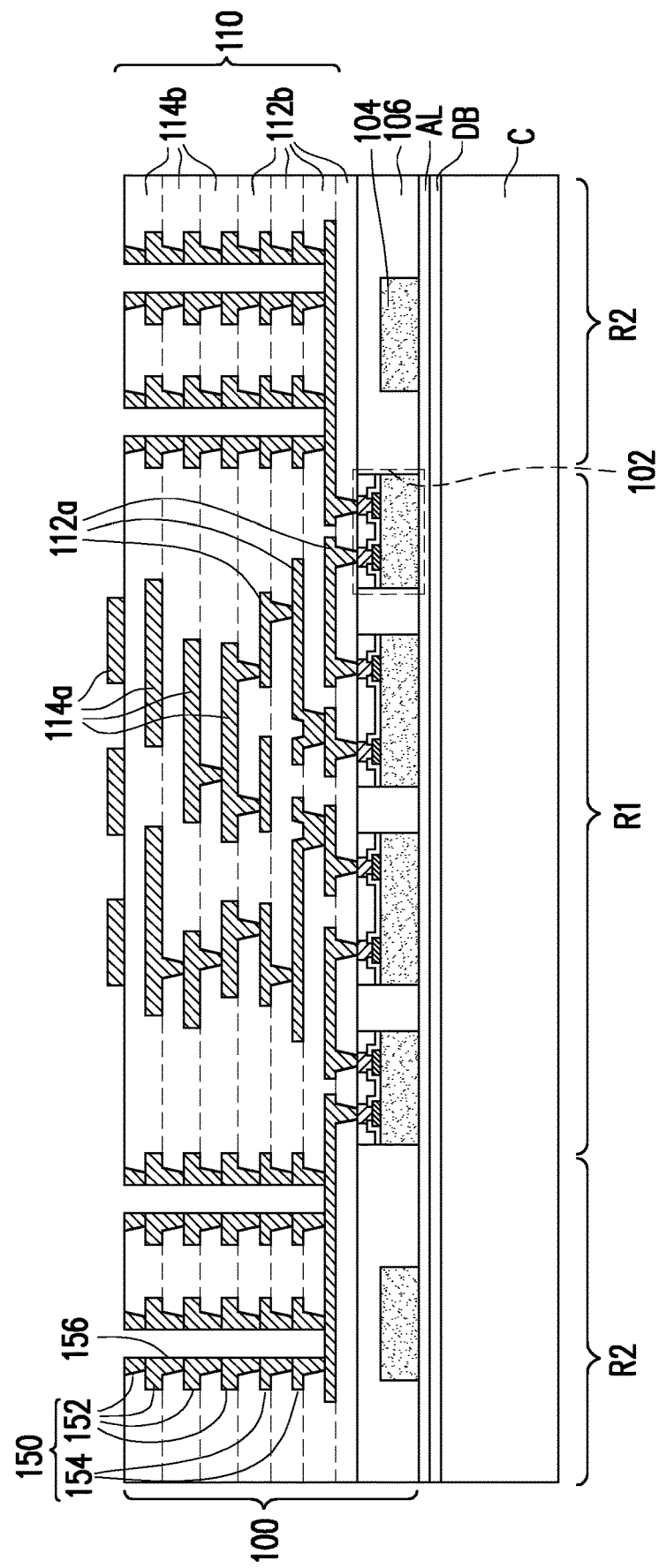

Referring to FIG. 10B, a plurality of holes 156 are formed in the vias 150 respectively. In some embodiments, the hole 156 is formed in the via 150 by partially removing the center portions of the conductive patterns 152, 154. In some embodiments, a method of partially removing the conductive patterns 152, 154 is a laser drilling process, for example. In some embodiments, the hole 156 is vertically disposed in the via 150 and surrounded by the conductive patterns 152, 154, for example. In some embodiments, the hole 156 penetrates the via 150 and stops at a top surface of the redistribution pattern 112a therebeneath, that is, the hole 156 exposes a portion of the redistribution pattern 112a. In some embodiments, a diameter of the hole 156 is constant and less than a minimum diameter of the conductive patterns 152, 154.

Figure 10C:
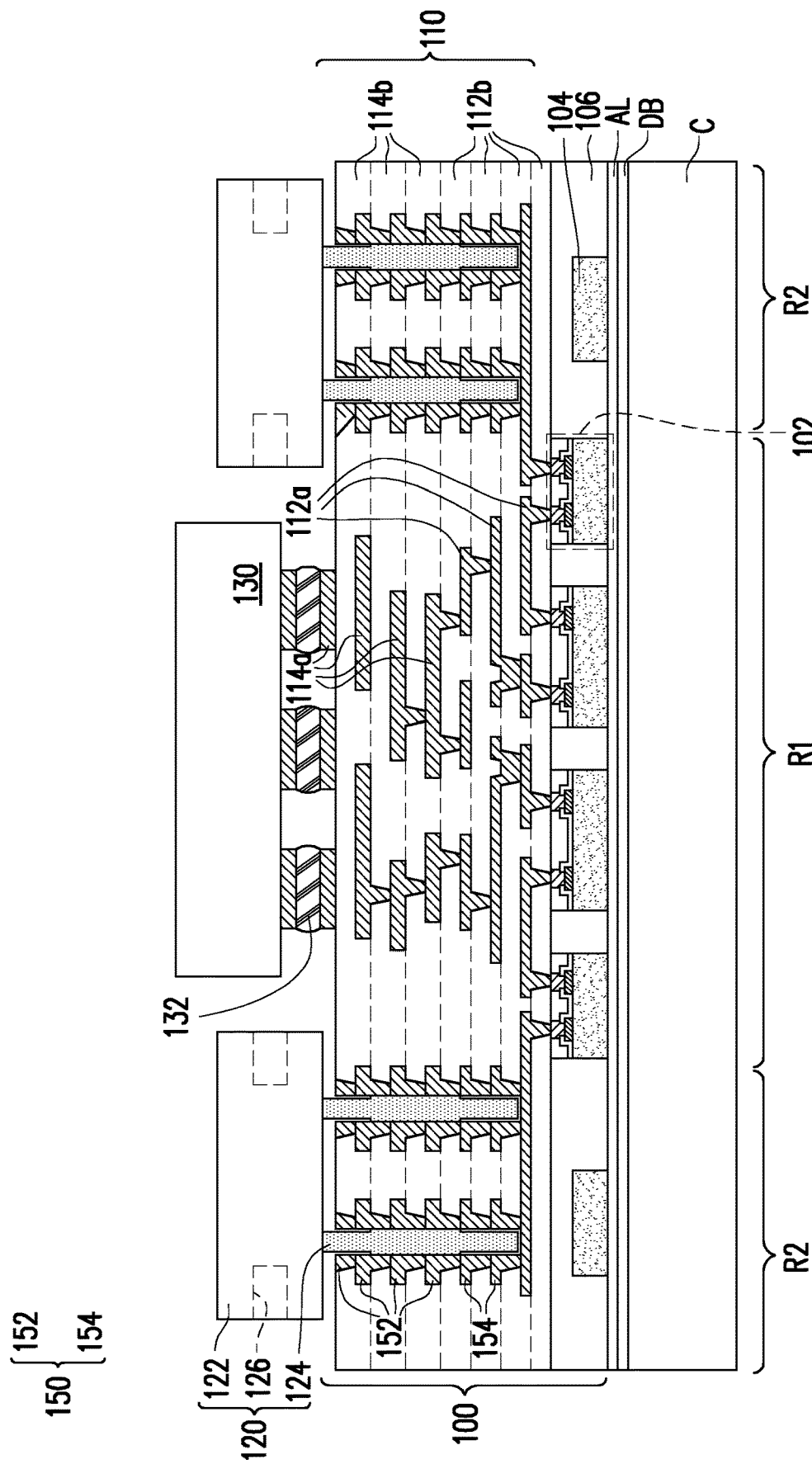

Referring to FIG. 10C, a connector 120 is formed in the vias 150 to electrically connect the die 102. The connector 120 of FIC. 10C is similar to the connector 120 of FIG. 3A, and the main difference lies in the structure of the connecting elements 124. In some embodiments, the connecting elements 124 are inserted into the holes 156 and electrically connected to the redistribution pattern 112a exposed by the holes 156. In other words, the connecting element 124 may be disposed in the dielectric layers 112b, 114b of the redistribution structure 110, for example. In some embodiments, the connecting elements 124 may be pins. In some embodiments, the connecting element 124 may have a center section and terminal sections connecting to the center section, and a width of the center section may be larger than a width of the terminal sections. In some embodiments, the connector 120 may be may be pressed fit into the holes 156, for example. In some embodiments, portions of the connecting elements 124 are in contact with inner sidewalls of the vias 150, so as to electrically connect the die through the redistribution pattern 112a. In some embodiments, the connecting elements 124 are not in contact with the bottoms of the holes 156 of the vias 150, for example. In other words, a length of the connecting element 124 may be less than a depth of the hole 156, and the connecting elements 124 may not be filled with the holes 156. However, in some alternative embodiments, a length of the connecting element 124 may be substantially equal to a depth of the hole 156, for example.

Figure 10D:
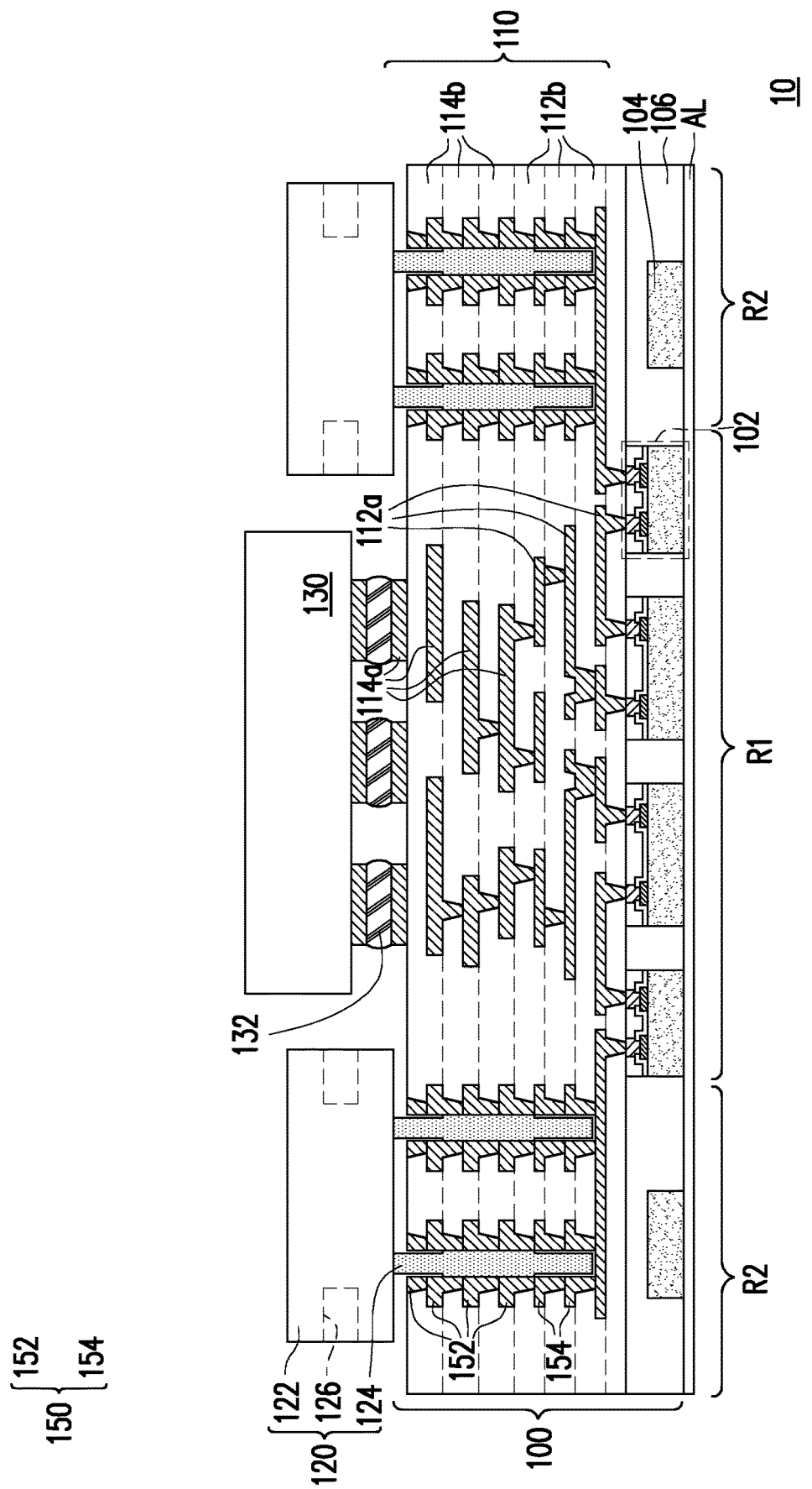

Referring to FIG. 10D, a socket 130 may be formed over the redistribution structure 110 aside the connector 120. Then, the carrier C is removed. In some embodiments, these steps are similar to those described above, and thus the details thereof will be omitted.

Figure 11A:
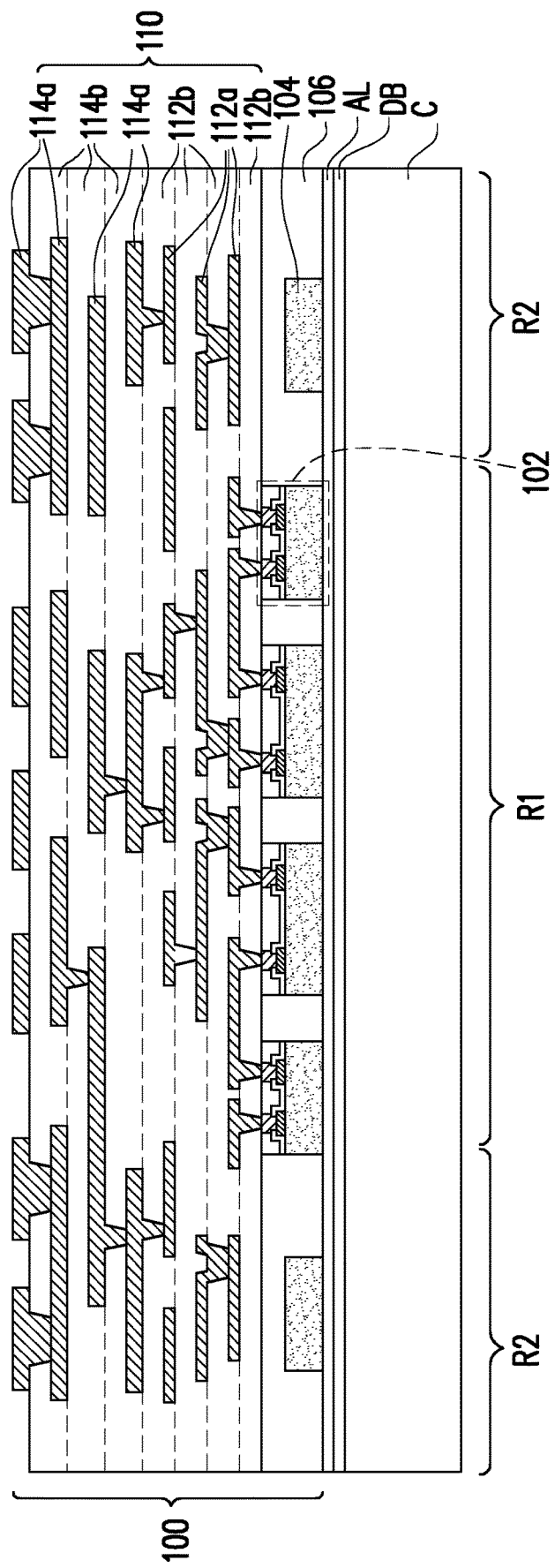
FIGS. 11A to 11E are schematic cross-sectional views illustrating a method of manufacturing a semiconductor device in accordance with some embodiments of the disclosure.

FIGS. 11A to 11E are schematic cross-sectional views illustrating a method of manufacturing a semiconductor device in accordance with some embodiments of the disclosure. Referring to FIG. 11A, a semiconductor package 100 is provided. The structure of the semiconductor package 100 is similar to the structure of the semiconductor package of FIG. 1C, and thus the details thereof will be omitted.

Figure 11B:
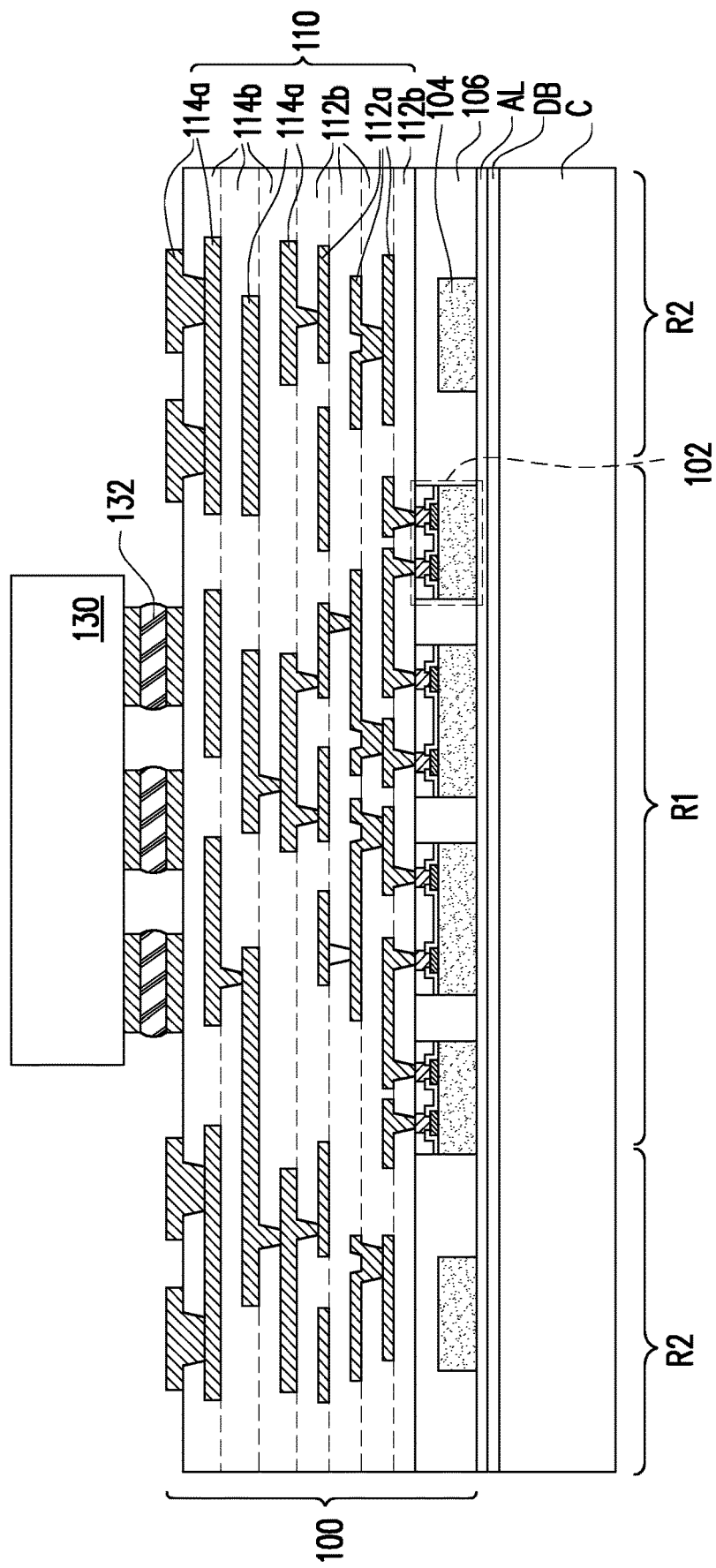

Referring to FIG. 11B, a socket 130 is formed over the redistribution structure 110 of the semiconductor package 100. In some embodiments, the structure and the forming method of the socket 130 are similar to those described in FIG. 1D, and thus the details thereof will be omitted.

Figure 11C:
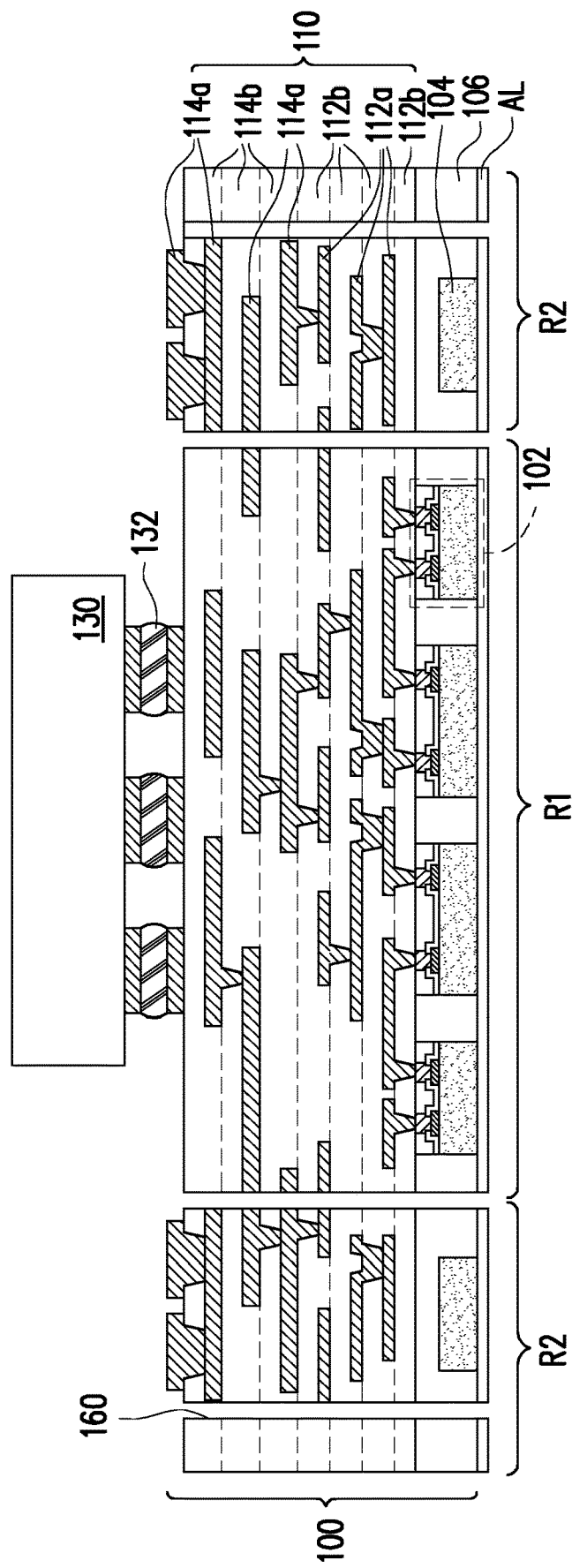
Figure 11D:
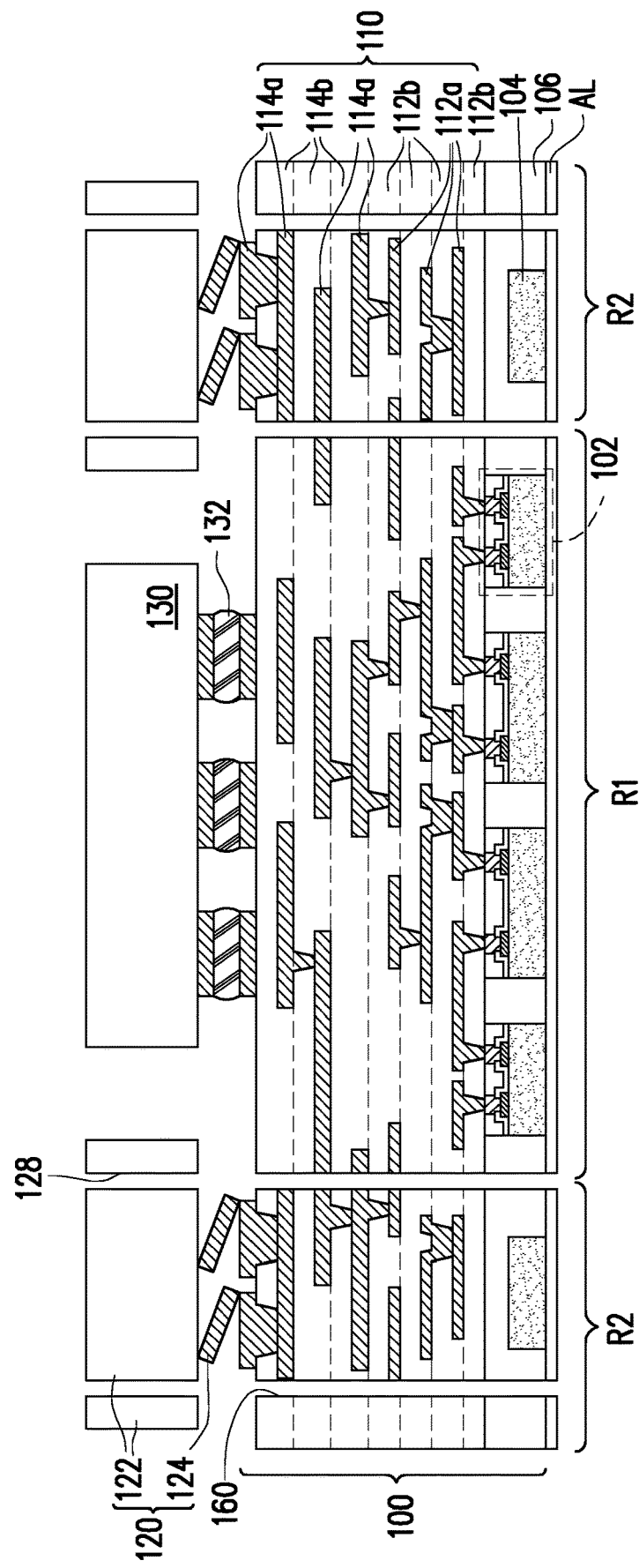

Referring to FIG. 11C, a plurality of holes 160 are formed in the semiconductor package 100 in the periphery region R2, and the carrier C is removed. In some embodiments, the hole 160 penetrates the redistribution structure 110, the encapsulant 106 and the adhesive layer AL, for example. In some embodiments, the hole 160 is formed by removing portions of the redistribution patterns 112a, 114a and the dielectric layers 112b, 114b, the encapsulant 106 and the adhesive layer AL. In some embodiments, a forming method of the holes 160 includes a laser drilling process or other suitable hole-forming method. In some embodiments, the holes 160 are separated from the topmost redistribution patterns 114a serving as the UBM patterns for the connectors 120 (as shown in FIG. 11D), for example. In addition, in some embodiments, the holes 160 are separated from the dummy dies 104, so as to avoid to crack the dummy dies 104. Then, the carrier C is removed. In some embodiments, the removing method of the carrier C is similar to those described above, and thus the details thereof will be omitted.

Referring to FIG. 11D, a plurality of connectors 120 are formed over the redistribution structure 110 of the semiconductor package 100. In some embodiments, a connecting element 124 of the connector 120 may be a spring, and thus the connector 120 may be a spring type connector, for example. In some embodiments, the connectors 120 are picked and placed onto the topmost redistribution patterns 114a of the redistribution structure 110 in the periphery region R2, and the connecting elements 124 are contact with the topmost redistribution patterns 114a, for example. In some embodiments, the connector 120 has a plurality holes 128 therethrough, and the holes 128 may be formed at the periphery of the connector 120 and separated from the connecting elements 124 by a distance. In some embodiments, the holes 128 of the connector 120 are aligned with the holes 160 of the semiconductor package 100.

Figure 11E:
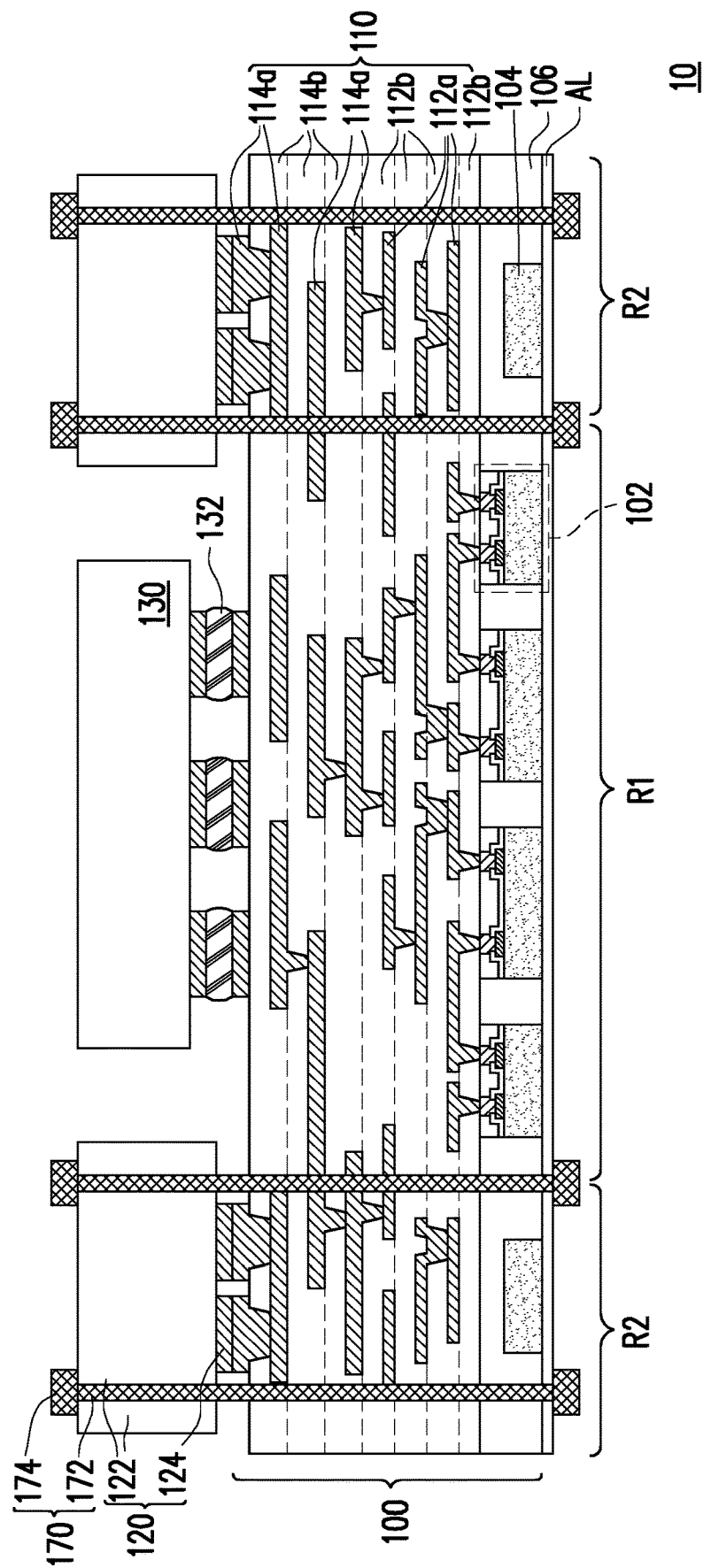

Referring to FIG. 11E, a plurality of fasteners 170 are inserted into the holes 128, 160 to secure the connector 120 and the semiconductor package 100. In some embodiments, the fastener 170 may include a screw 172 and a plurality of bolts 174 at two ends of the screw 172, for example. In some embodiments, by securing through the fasteners 170, the connecting elements 124 of the connector 120 are pressed and thus in contact with the top surfaces of the topmost redistribution patterns 114a, so as to electrically connect the die 102 through the redistribution structure 110.

Figure 12:
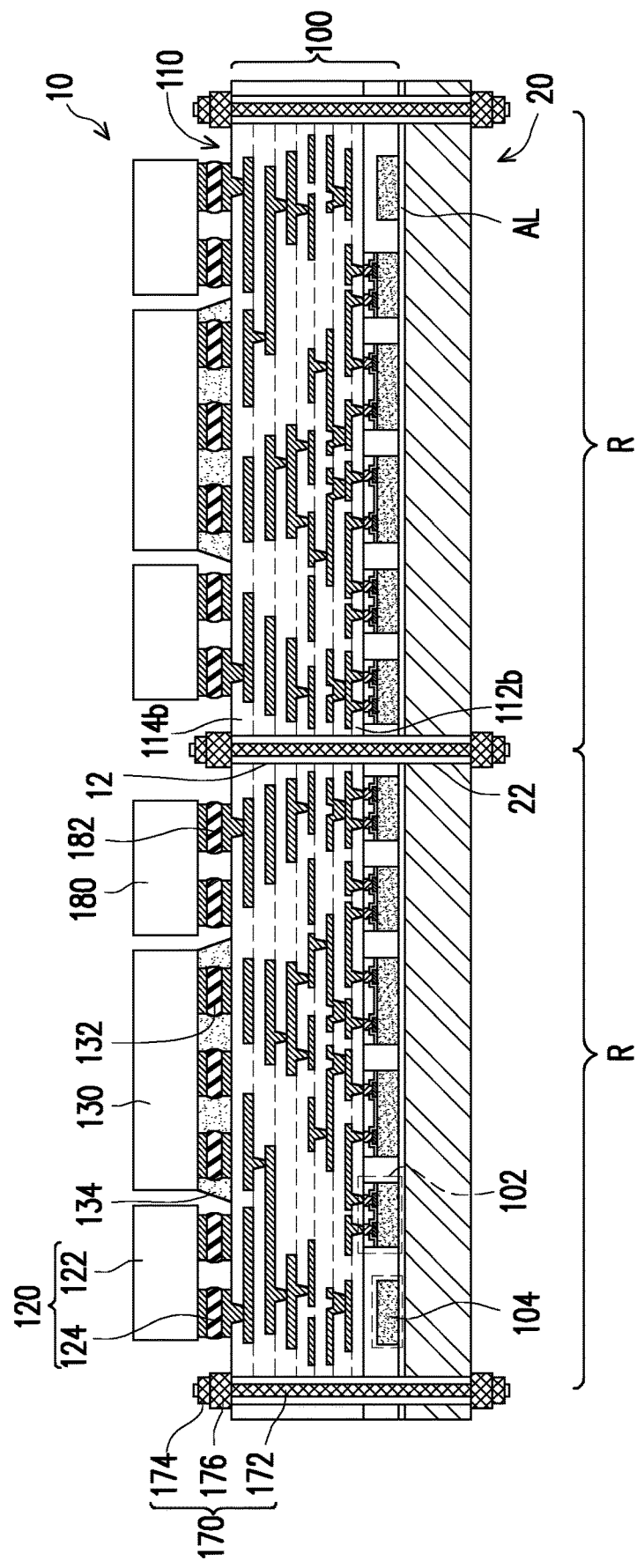
FIG. 12 is a schematic cross-sectional view illustrating a semiconductor structure in accordance with some embodiments of the disclosure.

FIG. 12 is a schematic cross-sectional view illustrating a semiconductor structure in accordance with some embodiments of the disclosure. Referring to FIG. 12, a semiconductor device 10 and a thermal module 20 are fixed by a plurality of fasteners 170. In some embodiments, first, the semiconductor device 10 is provided. In some embodiments, the semiconductor device 10 includes a semiconductor package 100, a plurality of connectors 120, a plurality of sockets 130 and a plurality of electrical components 180. In some embodiments, the semiconductor package 100 includes a plurality of regions R, and each region R has a plurality of dies 102 therein. An encapsulant 106 is formed to encapsulate the dies 102 in the regions R, and a redistribution structure 110 is continuously formed over a first side (such as frontside) of the dies 102 and encapsulant 106 in the regions R. In some embodiments, a plurality of dummy dies 104 may be formed at the periphery of the regions R. In some embodiments, the dummy die 104 is disposed at the outer side of the region R, for example. Then, the connector 120, the socket 130, and the electrical component 180 are disposed onto and electrically connected to the redistribution structure 110 in each region R. In some embodiments, the connector 120 is disposed at the outer side of the region R, for example. In some embodiments, the socket 130 may be a package with an underfill 134 therebeneath. In some embodiments, the electrical component 180 may be a passive device, for example. In some embodiments, the electrical component 180 has a plurality of connecting elements 182 such as solder balls thereon which are physically and electrically connected to the semiconductor package 100. In some embodiments, other packages or electrical components may be integrated onto the semiconductor package 100. In some embodiments, the semiconductor device 10 may have an adhesive layer AL therebeneath. In some embodiments, the adhesive layer AL may be a thermal interface material, for example. In some embodiments, the dies 102, the dummy dies 104, the encapsulant 106, the redistribution structure 110, the connector 120 and the socket 130 are similar to those described in above embodiments, and thus the details are omitted herein.

Then, the thermal module 20 is provided. In some embodiments, the thermal module 20 has a plurality of holes 22. In some embodiments, the thermal module 20 is a heat sink or a heat spreader, for example. After that, a plurality of holes 12 are formed in the semiconductor device 10 corresponding to the holes 22. In some embodiments, the holes 12 are formed in the dielectric layers 112b, 114b and the encapsulant 106, for example. In some embodiments, the holes 12 are formed between the regions R, for example. Then, a plurality of fasteners 170 are inserted into the holes 12 and holes 22 respectively, so as to fix the thermal module 20 onto the semiconductor device 10. In some embodiments, the fastener 170 penetrates the redistribution structure 110 and the encapsulant 106 of the semiconductor package 100 and the thermal module 20. In some embodiments, the fastener 170 is disposed between the regions R, in other words, the regions R are separated from each other by the fasteners 170. In some embodiments, the fastener 170 may include a screw 172 and a plurality of bolts 174 at two ends of the screw 172, for example. In addition, in some embodiments, the fastener 170 may further include a stiffener/brace 176, so as to fix the semiconductor devices 10 and the thermal module 20 more securely. In some embodiments, the thermal module 20 is disposed at a second side (such as backside) opposite to the first side of the dies 104. In some embodiments, the semiconductor package 100 may serve as a carrier to carry a plurality of electrical components such as the connector 120, the socket 130 and the electrical component 180, that is, the electrical components may be integrated onto the semiconductor package 100, and the connectors 120 at the periphery may serve as external input/output terminals of the semiconductor structure. In addition, the thermal module 20 may be fixed onto the semiconductor package 100 to provide good thermal dissipation. Accordingly, the performance of the semiconductor package is improved.

Conventionally, the semiconductor package and the connector are assembled to the circuit board as a system. However, in some embodiments, the connectors are directly integrated onto the semiconductor package as a subsystem to directly communicate with other systems. In other words, the circuit board may be omitted. Therefore, signal loss due to long pathway and/or insertion may be prevented, and in addition, the area for the circuit board is saved. Furthermore, the connectors on the semiconductor package such as an accelerator may serve as external input/output terminals to build an interconnection bridge between the semiconductor package and other electrical devices such as another accelerator or a CPU board. Therefore, signal path between the semiconductor package and the electrical device does not pass through the circuit board, and thus is able to significantly reduce insertion loss to provide high data transmission rate. Accordingly, the semiconductor device may be applied in a high-performance computing system. Furthermore, the semiconductor package may serve as a system carrier to carrier other packages, the passive devices, and the connectors, and may be further combined with other components such as thermal module, so as to provide a lot of functions.

In accordance with some embodiments of the present disclosure, a semiconductor device includes a semiconductor package and a connector. The semiconductor package includes at least one die in a die region, an encapsulant in a periphery region aside the die region and a redistribution structure in the die region and the periphery region. The encapsulant encapsulates the at least one die. The redistribution structure is electrically connected to the die. The connector is disposed on the redistribution structure in the periphery region. The connector includes a plurality of connecting elements, wherein the connector is electrically connected to the redistribution structure through the plurality of connecting elements.

In accordance with alternative embodiments of the present disclosure, a semiconductor structure includes a semiconductor device and an electrical device. The semiconductor device includes a first semiconductor package and a first connector on the first semiconductor package, wherein the first connector includes a plurality of first connecting elements and a first connecting portion different from the plurality of first connecting elements, and the first connector is electrically connected to the first semiconductor package through the plurality of connecting elements. The electrical device includes a second connector, wherein the second connector includes a plurality of second connecting elements and a second connecting portion different from the plurality of second connecting elements, and the semiconductor device and the electrical device are physically connected through the first connecting portion and the second connecting portion.

In accordance with yet alternative embodiments of the present disclosure, a semiconductor structure includes a semiconductor package, a connector, a thermal module and a fastener. The semiconductor package includes a plurality of regions, and each region includes a plurality of dies, an encapsulant encapsulating the plurality of dies and a redistribution structure over the plurality of dies and the encapsulant and electrically connected to the plurality of dies. The connector is disposed on the redistribution structure over a first side of the plurality of dies at the periphery of the plurality of regions and includes a plurality of connecting elements, wherein the connector is electrically connected to the redistribution structure through the plurality of connecting elements. The thermal module is disposed over a second side opposite to the first side of the plurality of dies. A fastener is disposed between the plurality of regions, and secures the thermal module onto the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor package, comprising:
      at least one die in a die region;
      an encapsulant in a periphery region aside the die region, encapsulating the at least one die; and
      a redistribution structure in the die region and the periphery region, electrically connected to the die;
   a connector on the redistribution structure in the periphery region, comprising a plurality of connecting elements, wherein the connector is electrically connected to the redistribution structure through the plurality of connecting elements; and
   a socket on the redistribution structure in the die region.

2. The semiconductor device of claim 1, wherein the connector is not disposed in the die region.

3. The semiconductor device of claim 1, wherein the plurality of connecting elements comprise solder balls, lands, pins or springs.

4. The semiconductor device of claim 1, wherein the plurality of connecting elements are further disposed in a dielectric layer of the redistribution structure.

5. The semiconductor device of claim 1, wherein the redistribution structure comprises a plurality of vias electrically connected to the die in the periphery region, and the plurality of connecting elements are inserted into and electrically connected to the plurality of vias respectively.

6. The semiconductor device of claim 1, further comprising a screw, wherein the connector is secured to the semiconductor package by the screw.

7. The semiconductor device of claim 1, wherein the connector further comprises a connecting housing, and the plurality of connecting elements protrude from the connecting housing.

8. A semiconductor structure, comprising:
   a semiconductor package, including a plurality of regions, each region comprising:
      a plurality of dies;
      an encapsulant encapsulating the plurality of dies; and
      a redistribution structure over the plurality of dies and the encapsulant, electrically connected to the plurality of dies;
   a connector on the redistribution structure over a first side of the plurality of dies at the periphery of the plurality of regions, comprising a plurality of connecting elements, wherein the connector is electrically connected to the redistribution structure through the plurality of connecting elements;
   a thermal module over a second side opposite to the first side of the plurality of dies; and
   a fastener between the plurality of regions, securing the thermal module onto the semiconductor package.

9. The semiconductor device of claim 8, wherein the fastener penetrates the redistribution structure and the encapsulant of the semiconductor package and the thermal module.

10. The semiconductor device of claim 8, wherein the connector is disposed on a periphery of the redistribution structure.

11. The semiconductor device of claim 8, wherein each region further comprises a socket on the redistribution structure aside the connector.

12. The semiconductor device of claim 8, wherein the plurality of connecting elements comprise solder balls, lands, pins or springs.

13. A semiconductor structure, comprising:
   a first semiconductor package and a first connector on a periphery region of the first semiconductor package, wherein the first connector comprises a first connecting housing, a plurality of first connecting elements at a first side of the first connecting housing and a first connecting portion at a second side different from the first side of the first connecting housing, and the first connecting elements are disposed between the first connecting housing and the first semiconductor package and electrically connect to the first semiconductor package; and
   a second semiconductor package and a second connector on a periphery region of the second semiconductor package, wherein the second connector comprises a second connecting housing, a plurality of second connecting elements at a first side of the second connecting housing and a second connecting portion at a second side different from the first side of the second connecting housing and facing the first connecting portion, the second connecting elements are disposed between the second connecting housing and the second semiconductor package and electrically connect to the second semiconductor package, and the first connecting portion and the second connecting portion are physically connected to connect the first semiconductor device and the second semiconductor device.

14. The semiconductor device of claim 13, wherein the first connecting portion and the second connecting portion are engaged with each other to connect the first semiconductor device and the second semiconductor device.

15. The semiconductor device of claim 13 further comprising a third connector, wherein the first connector and the third connector are disposed on opposite sides of the periphery region of the first semiconductor package, and the third connector comprises a third connecting housing, a plurality of third connecting elements at a first side of the third connecting housing and a third connecting portion at a second side different from the first side of the third connecting housing.

16. The semiconductor device of claim 13, wherein the first semiconductor package and the second semiconductor package are arranged in series.

17. The semiconductor device of claim 13, wherein the first semiconductor package, the first connector, the second connector and the second semiconductor package are arranged sequentially in a vertical direction.

18. The semiconductor device of claim 13, wherein the first connector is not extended beyond the first semiconductor package, and the second connector is not extended beyond the second semiconductor package.

19. The semiconductor device of claim 13 further comprising a cable disposed between and physically connecting the first connecting portion and the second connecting portion.

20. The semiconductor device of claim 13, wherein the first semiconductor package comprises:
    at least one die in a die region surrounded by the periphery region; and
    a redistribution structure in the die region and the periphery region, electrically connected to the die and the first connecting elements.

* * * * *